United States Patent
Lin et al.

(10) Patent No.: US 9,520,371 B2
(45) Date of Patent: Dec. 13, 2016

(54) PLANAR PASSIVATION FOR PADS

(71) Applicant: GLOBALFOUNDRIES Singapore Pte. Ltd., Singapore (SG)

(72) Inventors: Benfu Lin, Singapore (SG); Wanbing Yi, Singapore (SG); Wei Lu, Singapore (SG); Alex See, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/525,154

(22) Filed: Oct. 27, 2014

(65) Prior Publication Data

US 2016/0118355 A1   Apr. 28, 2016

(51) Int. Cl.
| | | |
|---|---|---|
| *H01L 23/00* | (2006.01) | |
| *H01L 21/3105* | (2006.01) | |
| *H01L 21/768* | (2006.01) | |
| *H01L 23/522* | (2006.01) | |
| *H01L 23/528* | (2006.01) | |
| *H01L 23/31* | (2006.01) | |
| *H01L 23/532* | (2006.01) | |

(52) U.S. Cl.
CPC ......... *H01L 24/05* (2013.01); *H01L 21/31051* (2013.01); *H01L 21/76807* (2013.01); *H01L 21/76877* (2013.01); *H01L 23/3192* (2013.01); *H01L 23/53295* (2013.01); *H01L 24/03* (2013.01); *H01L 23/3114* (2013.01); *H01L 23/53214* (2013.01); *H01L 23/53228* (2013.01); *H01L 2224/0391* (2013.01); *H01L 2224/04042* (2013.01); *H01L 2224/05025* (2013.01); *H01L 2224/05573* (2013.01); *H01L 2924/06* (2013.01); *H01L 2924/07025* (2013.01)

(58) Field of Classification Search
None
See application file for complete search history.

(56) References Cited

U.S. PATENT DOCUMENTS

| | | | |
|---|---|---|---|
| 2012/0032323 A1* | 2/2012 | Matsumoto | ....... H01L 21/76801 257/737 |
| 2014/0061924 A1* | 3/2014 | Chen | ..................... H01L 23/481 257/758 |

* cited by examiner

*Primary Examiner* — Khaja Ahmad
(74) *Attorney, Agent, or Firm* — Horizon IP Pte. Ltd.

(57) ABSTRACT

Devices and methods for forming a device are presented. The method includes providing a substrate having circuit component and a dielectric layer over the substrate. The dielectric layer includes a plurality of inter level dielectric (ILD) layers and the uppermost dielectric layer includes at least one interconnect. A pad dielectric layer is provided over the uppermost ILD layer. A pad interconnect for receiving a wire bond is formed in the pad dielectric layer. The pad interconnect is coupled to the at least one interconnect of the uppermost ILD layer. A top surface of the pad dielectric layer is substantially coplanar with a top surface of the pad interconnect. A passivation layer is formed over the pad dielectric layer.

20 Claims, 25 Drawing Sheets

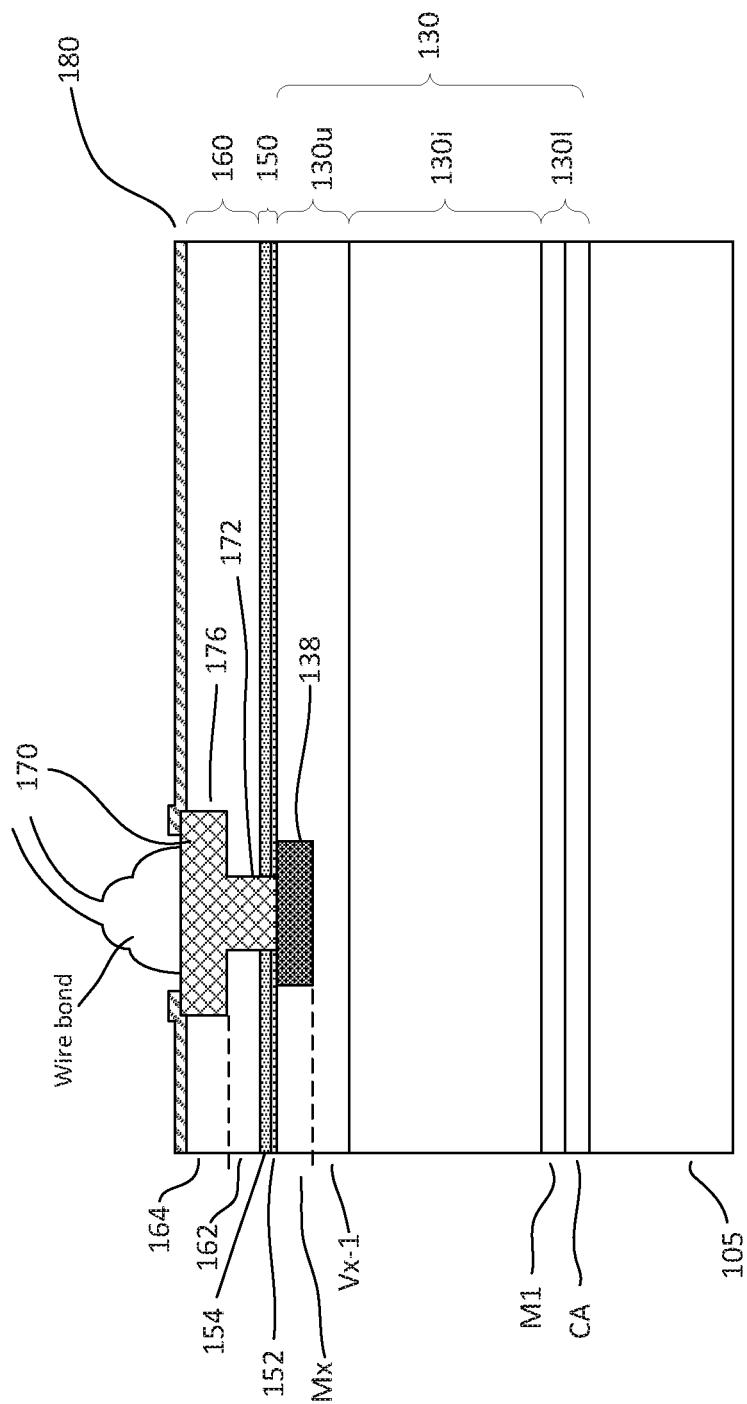

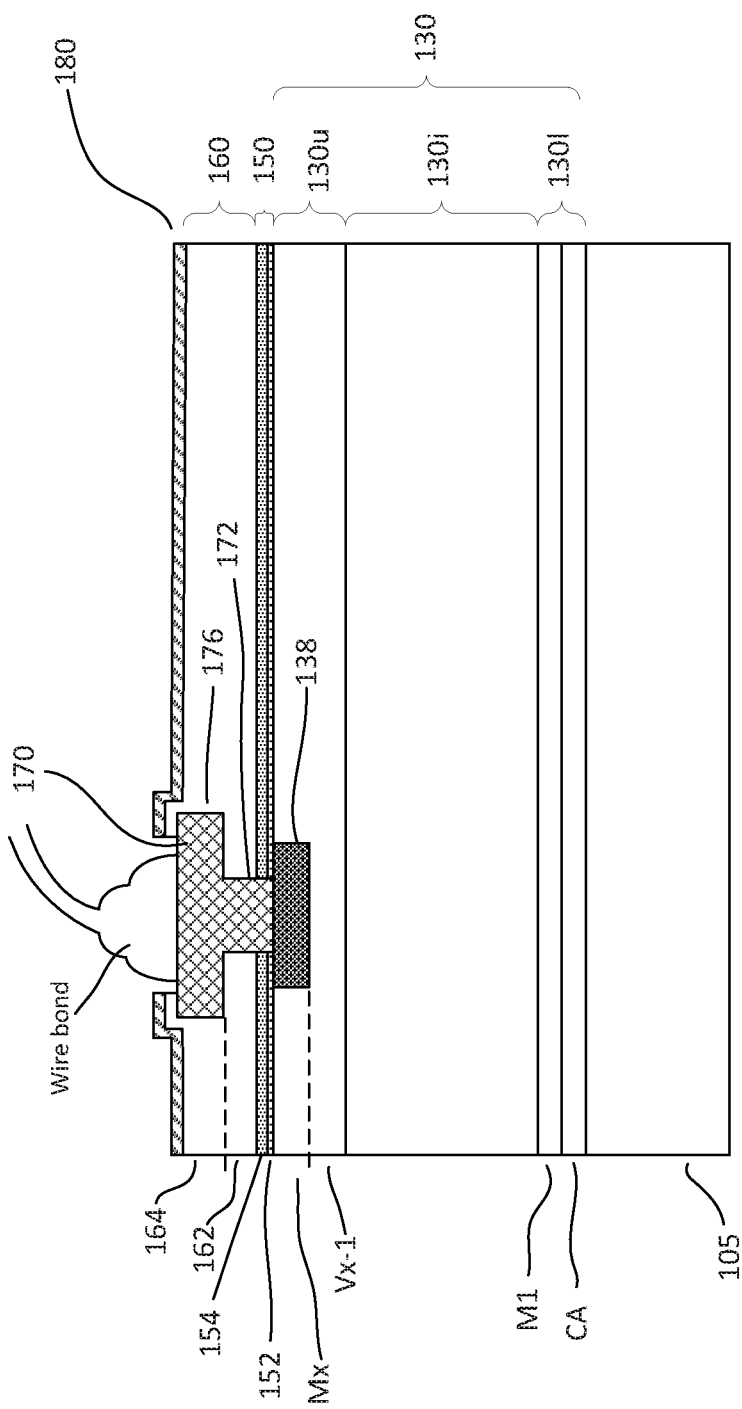

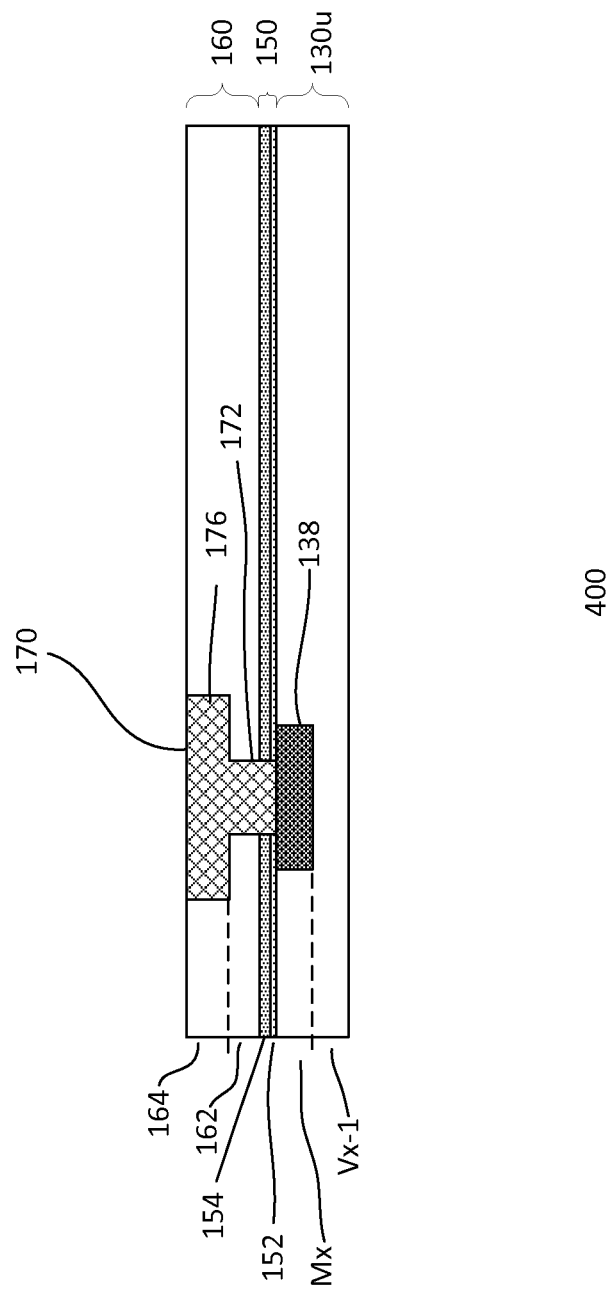

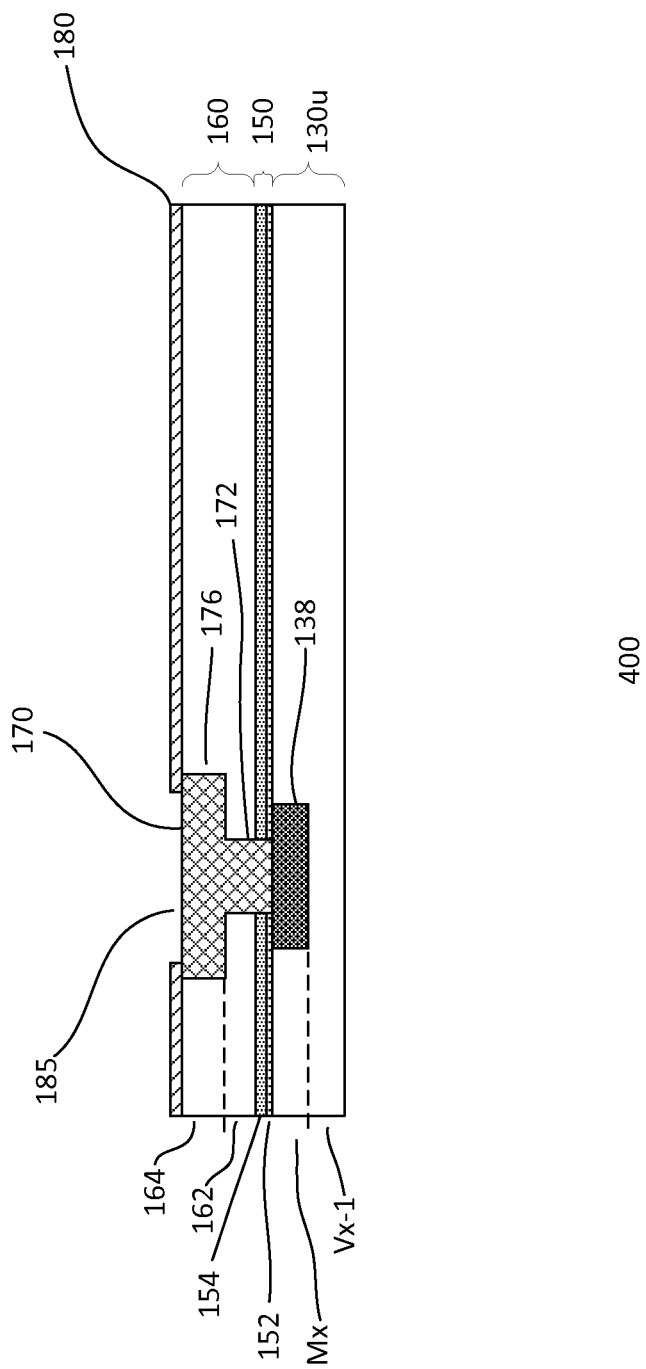

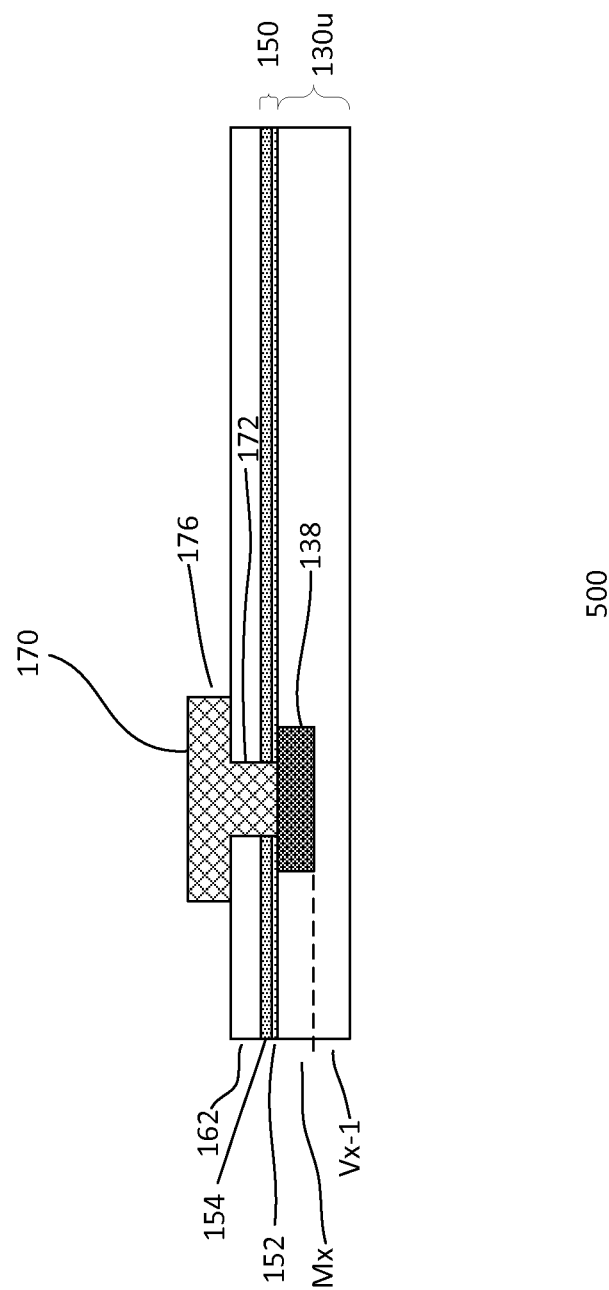

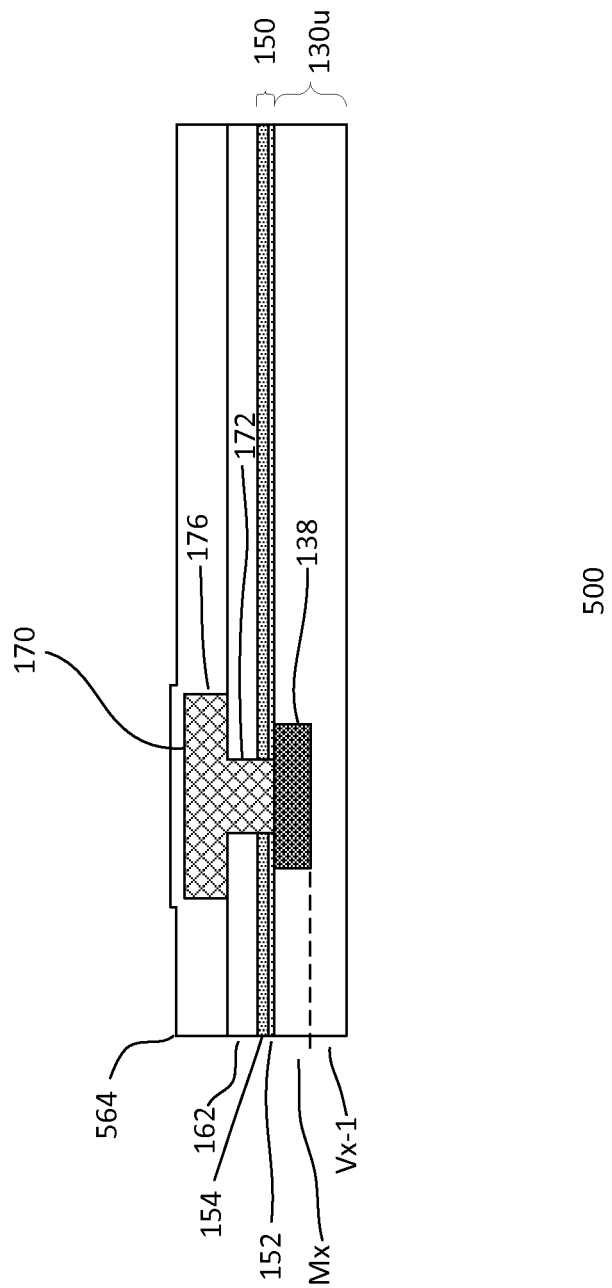

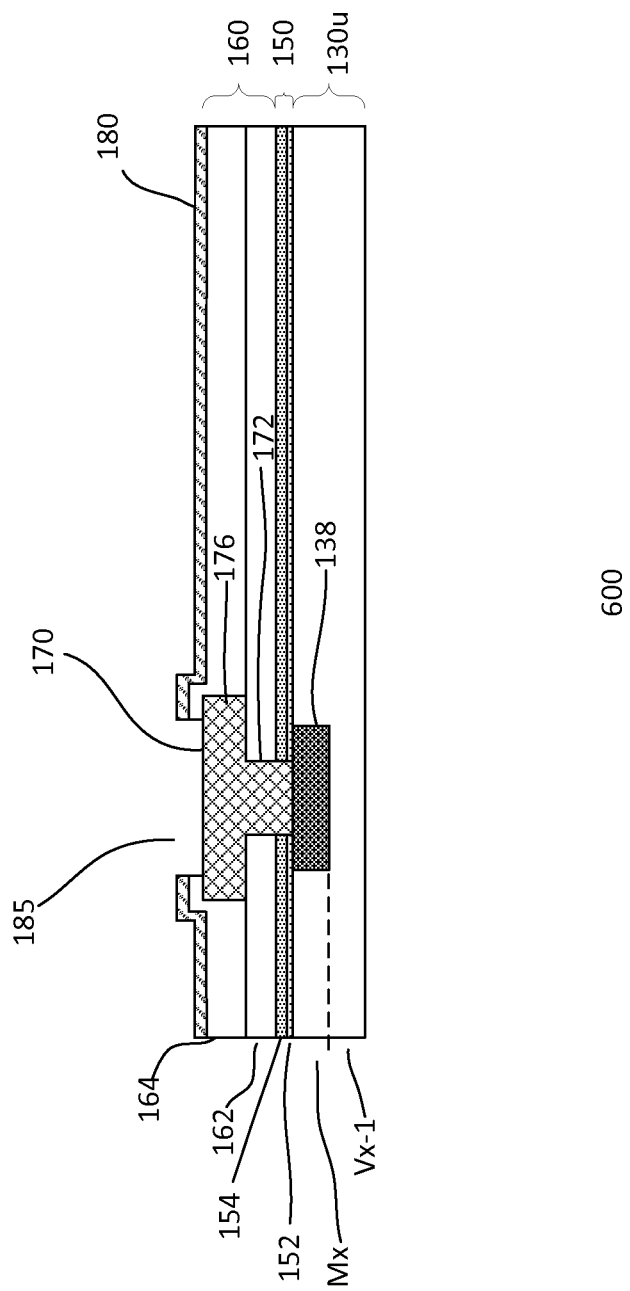

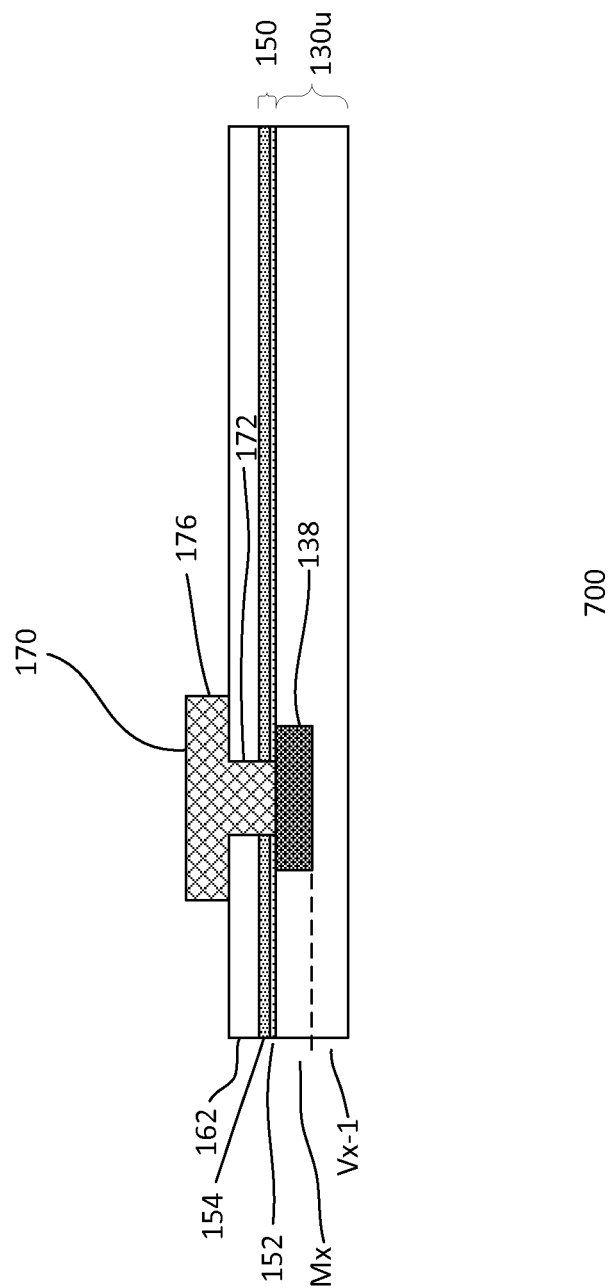

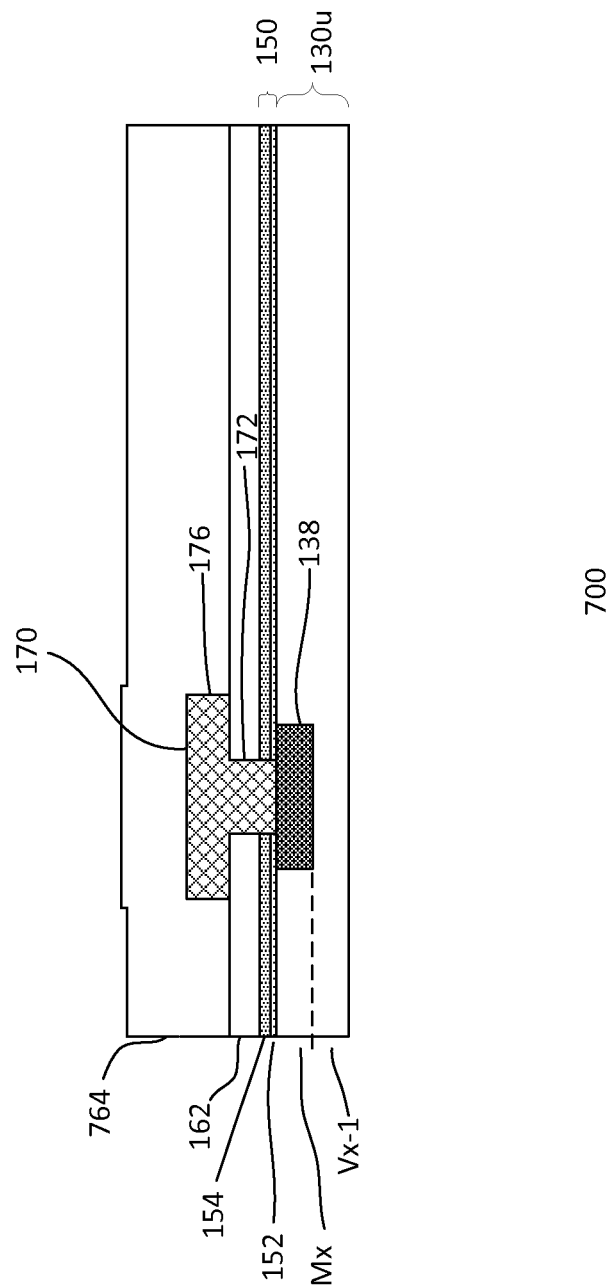

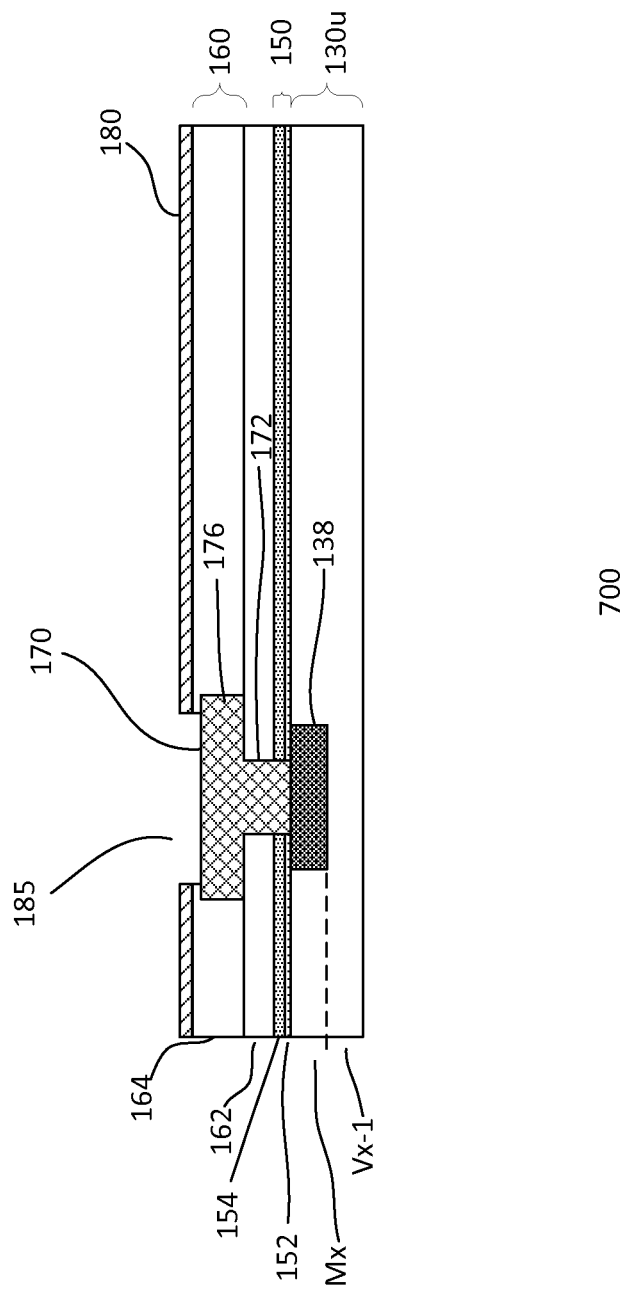

PLANAR PASSIVATION FOR PADS

BACKGROUND

In semiconductor device fabrication, back-end-of-line (BEOL) wafer processing generally involves creating various interconnecting metal layers that may be interconnected by vias. Wire bonding pads or pad interconnects are connected to the interconnects and are used to connect an integrated circuit (IC) to other ICs or electronic devices. Wire bonds are attached to the wire bonding pads.

However, we have observed that some traditional wire bond pad structures suffer from several disadvantages. For example, traditional wire bond pad structure experiences high shear stress due to coefficient thermal expansion (CTE) mismatch between the conductive bond pad and underlying dielectric layer. This causes the passivation layer disposed over the conductive bond pad to crack and delaminate from the dielectric layer. In addition, we have also found that traditional wire bond pad structures have high risk of low bump yield due to poor under bump metallization (UBM) gap fill and undesired bump residues appearing in the passivation layer, lowering the reliability of the wire bond pad structures.

From the foregoing discussion, it is desirable to provide reliable bond pad structures and methods of manufacturing the same.

SUMMARY

Embodiments of the present disclosure generally relate to semiconductor devices and methods for forming a device. In one embodiment, a method for forming a device is presented. The method includes providing a substrate having circuit component and a dielectric layer over the substrate. The dielectric layer includes a plurality of inter level dielectric (ILD) layers and the uppermost dielectric layer includes at least one interconnect. A pad dielectric layer is provided over the uppermost ILD layer. A pad interconnect for receiving a wire bond is formed in the pad dielectric layer. The pad interconnect is coupled to the at least one interconnect of the uppermost ILD layer. A top surface of the pad dielectric layer is substantially coplanar with a top surface of the pad interconnect. A passivation layer is formed over the pad dielectric layer.

In another embodiment, a device is disclosed. The device includes a substrate having circuit component and a dielectric layer over the substrate. The dielectric layer includes a plurality of inter level dielectric (ILD) layers and the uppermost dielectric layer includes at least one interconnect. A pad dielectric layer is disposed over the uppermost ILD layer. A pad interconnect for receiving a wire bond is disposed in the pad dielectric layer. The pad interconnect is coupled to the at least one interconnect of the uppermost ILD layer. A top surface of the pad dielectric layer is substantially coplanar with a top surface of the pad interconnect. A passivation layer is disposed over the pad dielectric layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 2a-2b show cross-sectional views of other embodiments of devices;

FIGS. 4a-4g show an embodiment of a process for forming a device;

FIGS. 5a-5g show another embodiment of a process for forming a device;

FIGS. 6a-6b show yet another embodiment of a process for forming a device; and

FIGS. 7a-7e show yet an embodiment of a process for forming a device.

DETAILED DESCRIPTION

Embodiments of the present disclosure generally relate to semiconductor devices. Embodiments generally relate to devices, such as semiconductor devices or ICs. Other suitable types of devices may also be useful. The devices can be any type of IC, for example dynamic or static random access memories, signal processors, or system-on-chip (SoC) devices. The devices can be incorporated into, for example, consumer electronic products, such as computers, cell phones, and personal digital assistants (PDAs). Incorporating the devices in other applications may also be useful.

Figure 1:
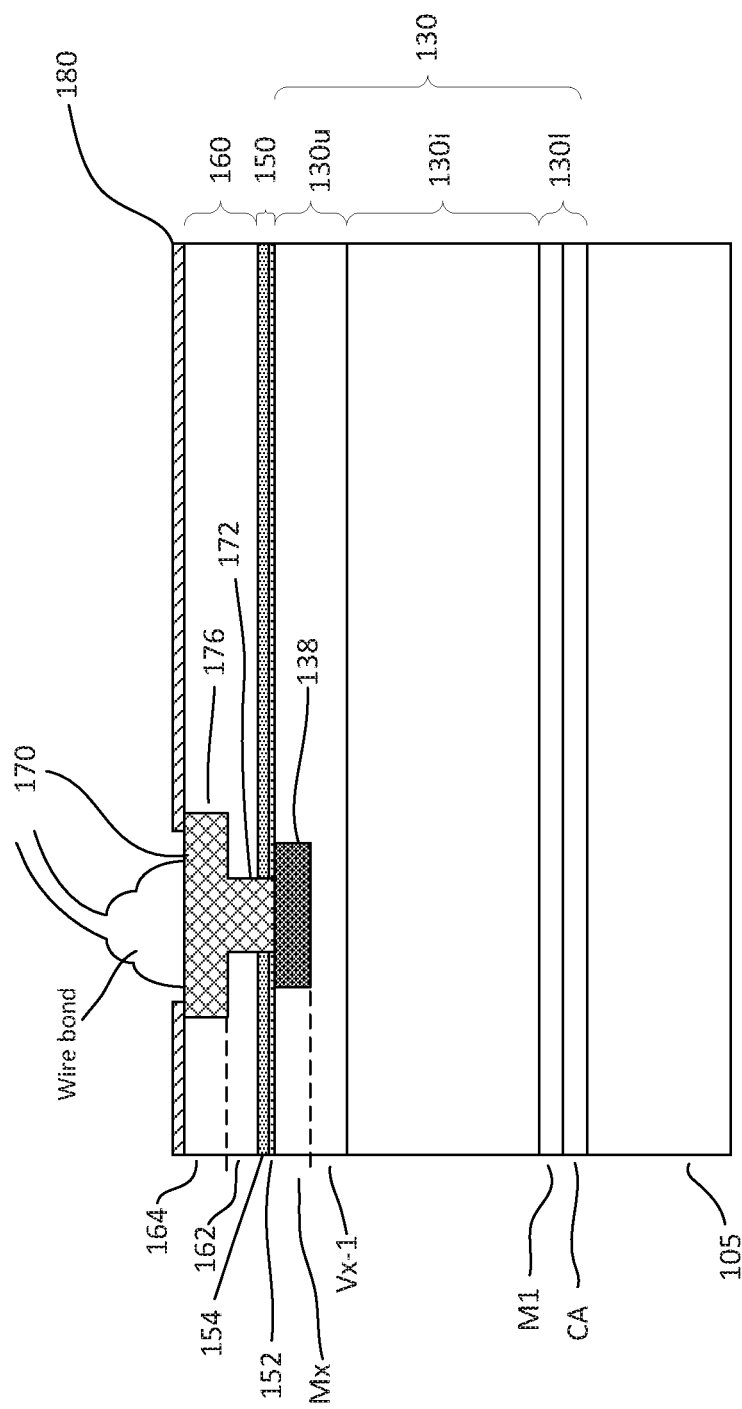
FIG. 1 shows a cross-sectional view of an embodiment of a device.

FIG. 1 shows an embodiment of a device 100. The device, for example, is an integrated circuit (IC). Other types of devices may also be useful. The device includes a substrate 105. The substrate, for example, is a semiconductor substrate, such as a silicon substrate or wafer. For example, the substrate may be a lightly doped p-type substrate. Other types of semiconductor substrates, including crystalline on insulator (COI) substrates, such as silicon-on insulator (SOI) substrates, may also be useful.

The substrate may include various types of regions. Such regions, for example, may include high voltage (HV), memory and logic regions. High voltage devices are formed in the high voltage region, logic devices are formed in the logic regions while memory devices are formed in the memory or array region. The devices, for example, are metal oxide semiconductor (MOS) transistors. Other suitable types of devices or device regions may also be useful.

Front end of line (FEOL) processing is performed on the substrate. For example, isolation regions are formed to isolate different device regions. The isolation regions, for example, are shallow trench isolation (STI) region. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, forming gate oxide layer, such as thermal silicon oxide followed by a gate electrode layer, such as polysilicon. The gate electrode may be doped. Other suitable types of gate materials may also be useful. Separate processes may be performed for forming gate dielectrics of the different voltage transistors. This is due to, for example, different gate oxide thicknesses associated with the different voltage transistors. For example, HV transistor will have a thicker gate dielectric than a LV transistor.

After the gate layers are formed, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming the transistors, back-end-of-line (BEOL) processing is performed. The BEOL process includes forming interconnects in interlevel dielectric (ILD) layers 130. The interconnects connect the various components of the IC to perform the desired functions. An ILD layer includes a metal level and a contact level. Generally, the metal level includes conductors or metal lines while the contact level includes contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other suitable techniques, such as but not limited to RIE, may also be employed to form metal lines.

A device may include a plurality of ILD layers or levels. For example, x number of ILD levels may be provided. For example, 5 ILD levels (x=5) may be provided. Other number of ILD levels may also be useful. The number of ILD levels may depend on, for example, design requirements or the logic process involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer (PMD) or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other suitable techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The dielectric layer, for example, is a silicon oxide layer. Other suitable types of dielectric layers may also be useful. The dielectric layer may be formed by CVD. Other suitable techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electrochemical or electroless plating. Other suitable types of conductive layers or forming techniques may also be useful. The first metal level M1 and CA may be referred to as a lower ILD level 1301.

The process continues to form additional ILD layers. For example, the process continues to form intermediate ILD levels 130i. Intermediate ILD level may include ILD level 2 to ILD level x−1. For example, in the case where x=5 (5 levels), the intermediate levels include ILD levels from 2 to 4, which includes M2 to M4.

The number of ILD layers may depend on, for example, design requirements or the logic process involved. These ILD layers may be referred to as intermediate ILD layers 130i. The intermediate ILD layers may be formed of silicon oxide. Other suitable types of dielectric materials, such as low k, high k or a combination of dielectric materials may also be useful. The ILD layers may be formed by, for example, CVD. Other suitable techniques for forming the ILD layers may also be useful.

The conductors and contacts of the intermediate ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as but not limited to copper or copper alloy. The conductive layer may be formed by, for example, plating techniques. Excess conductive material is removed, forming conductor and contacts in the intermediate ILD layer.

A dielectric liner (not shown) may be disposed between ILD levels and on the substrate. The dielectric liner, for example, serves as an etch stop layer. The dielectric liner may be formed of a low k dielectric. For example, the dielectric liner may be nBLOK. Other suitable types of dielectric materials for the dielectric liner may also be useful.

An upper ILD level 130u is provided over the top of the intermediate ILD layer. The upper ILD level includes Mx and Vx−1. For example, in the case where the device includes 5 metal levels, the upper ILD level includes M5 and V4. The upper ILD layer may have different design rules, such as critical dimension (CD), than the intermediate ILD layers. For example, upper ILD layer may have a larger CD than the intermediate ILD layers. For example, the upper ILD layer may have a CD which is 2× or 6× the CD of the intermediate ILD layers. Interconnects and contacts in the upper ILD layers may be formed by dual damascene processes, similar to those formed in the intermediate ILD layers. Other suitable techniques may also be useful.

A pad level or pad dielectric layer 160 is disposed over the upper ILD level. A protection layer 150 is provided between the upper ILD level and the pad level. The protection layer is a dielectric layer. In one embodiment, the protection layer is a dielectric protection layer stack with lower and upper protection layers or sub-layers 152 and 154. The lower protection layer is nBLOK and the upper protection layer is a nitride layer. The dielectric protection layer stack, for example, may serve as an etch stop layer and protect Copper (Cu) from diffusion or oxidation. The thickness of the lower protection layer 152 may be about 1000 Å while the upper protection layer 154 may be about 2000 Å thick. Other suitable types of protection layers or thicknesses may also be useful. In some embodiments, the protection layer may be a single layer. For example, the protection layer may be a silicon nitride layer.

As for the pad level, it includes lower and upper pad levels 162 and 164. The lower pad level 162 serves as a pad via level and the upper pad level 164 serves as a pad contact level. The thickness of the lower level 162 may be about 5000 Å and the thickness of the upper level 164 may be about 3 μm. Other suitable thicknesses for the levels may also be useful. The pad level may be a dielectric layer. For example, the pad level may be a silicon oxide layer. Other suitable types of dielectric layers may also be useful. For example, the pad layer may be a spin-on-glass (SOG), plasma enhanced tetraethylorthosilicate/borophosphosilicate glass (PETEOS/BPSG), or polyimide or combination of dielectric layers. In one embodiment, the pad level includes one dielectric layer. The single pad level may be a silicon oxide layer. Other types of dielectric layers may also be useful for the single pad dielectric layer. Providing a pad level having multiple dielectric layers may also be useful. For example, the upper and lower pad levels may be different types of dielectric layers. In one embodiment, the lower pad layer is a silicon oxide layer while the upper pad layer is a SOG layer. The SOG layer or film, for example, enables coplanar surface with small topography. Other suitable configurations of the lower and upper pad layers may also be useful.

As shown, a pad interconnect 170 is disposed in the pad layer. The interconnect includes a pad via contact 172 in the pad via level and a contact pad 176 in the pad contact level. The pad via contact is electrically coupled to an interconnect 138 in the upper ILD level 130u. For example, the pad via contact penetrates through the protection layer disposed between the upper ILD level and pad level. The pad interconnect, in one embodiment, is an Aluminum (Al) pad interconnect. Other suitable conductive materials, such as but not limited to Cu, may also be used to serve as the pad interconnect. In one embodiment, the pad via contact and the contact pad may be formed of the same material. For example, the pad via contact and contact pad may be formed of Al. In one embodiment, the pad via contact and contact pad are an integral unit. For example, the pad via contact and contact pad are formed by a dual damascene process. The dual damascene process may be via first or via last process.

In one embodiment, a top surface of the pad level is coplanar with a top surface of the pad interconnect as shown in FIG. 1. Providing a top surface of the pad dielectric layer which is almost or substantially coplanar with the top surface of the pad interconnect may also be useful. For example, having the top surface of the pad dielectric layer which may be slightly above or below the top surface of the pad interconnect may also be useful. The height difference between the top surfaces may vary, depending on film scheme and CTE property of the materials of the various layers. The top surfaces of the pad interconnect and pad dielectric layer should be sufficiently coplanar to reduce stress related defects, such as delamination and cracking, in a passivation layer 180.

The passivation layer 180 is disposed over the surface of the pad dielectric layer 160. The passivation layer is used for preventing pad surface from oxidation/corrosion and contamination during wire bonding and packaging process. The passivation layer, in one embodiment, is a silicon nitride layer. Other suitable types of passivation layers may also be useful. The passivation layer may be, for example, about 5000 Å thick. Other suitable thicknesses may also be useful.

FIGS. 2a-2b show other embodiments of devices. The device 200a or 200b, for example, is an integrated circuit (IC). Other types of devices may also be useful. The devices are similar to that described in FIG. 1. Common elements and features having the same reference numerals may not be described or described in detail.

Referring to FIG. 2a, the device includes a substrate 105. The substrate may include various types of regions, such as HV, memory and logic regions. Other suitable types of devices or device regions may also be useful. The substrate includes transistors on the substrate. Other suitable types of components may also be provided on the substrate. Disposed on the substrate over the transistors are ILD layers 130. For example, ILD layers 1-x are provided over the substrate over the transistors.

A pad level 160 is disposed over the upper ILD level 130u. A protection layer 150 is provided between the upper ILD level and the pad level. The pad level includes lower and upper pad levels 162 and 164. In one embodiment, the lower pad level is a silicon oxide layer and the upper pad level is a SOG layer. Other suitable configurations of the pad dielectric layers may also be useful.

A pad interconnect 170 is disposed in the pad layer. The interconnect includes a pad via contact 172 in the pad via level and a contact pad 176 in the pad contact level. The pad interconnect, in one embodiment, is an Al pad interconnect. Other suitable conductive materials, such as but not limited to Cu, may also be used to serve as the pad interconnect. In one embodiment, the pad via contact and the contact pad may be formed of the same material. For example, the pad via contact and contact pad may be formed of Al. Forming the pad interconnect of different materials may also be useful. In one embodiment, the pad via contact and contact pad are formed using separate processes. In one embodiment, the pad via contact is formed by a damascene process and the contact pad is formed by RIE process. Forming the pad via contact and contact pad by other suitable types of processes may also be useful.

A top surface of the pad dielectric layer 160 is almost or substantially coplanar with a top surface of the pad interconnect 170. As shown, the top surface of the pad dielectric layer is slightly below the top surface of the pad interconnect. This creates a small step between the top surfaces of the pad interconnect and pad dielectric layer. The height of the step or height difference between the top surfaces is about 2000-4000 Å. Other suitable height difference between the top surfaces may also be useful as long as it reduces stress related defects in the passivation layer 180.

A passivation layer 180 is disposed over the surface of the pad dielectric layer 160. The passivation layer is used for preventing pad surface from oxidation/corrosion and contamination during wire bonding and packaging process. The passivation layer, in one embodiment, is a silicon nitride layer. Other suitable types of passivation layers may also be useful. The passivation layer may be, for example, about 5000 Å thick. Other suitable thicknesses may also be useful.

In an alternative embodiment, as shown in FIG. 2b, the top surface of the pad dielectric layer 160 adjacent to the pad interconnect 170 is slightly above the top surface of the pad interconnect 170. In one embodiment, the top surface of the pad dielectric includes a small step profile created by the pad interconnect. For example, the top surface of the pad dielectric over the pad interconnect has a first height and a second height away from the pad interconnect, in which the first height is slightly higher than the second height. The small step profile may include any suitable dimension which reduces stress related defects in the passivation layer. The height differential in the top surfaces creates a step height in the passivation layer 180 as shown in FIG. 2b. Alternatively, the top surfaces of the pad dielectric layer and pad interconnect are coplanar, similar to that depicted in FIG. 1.

Figure 3:
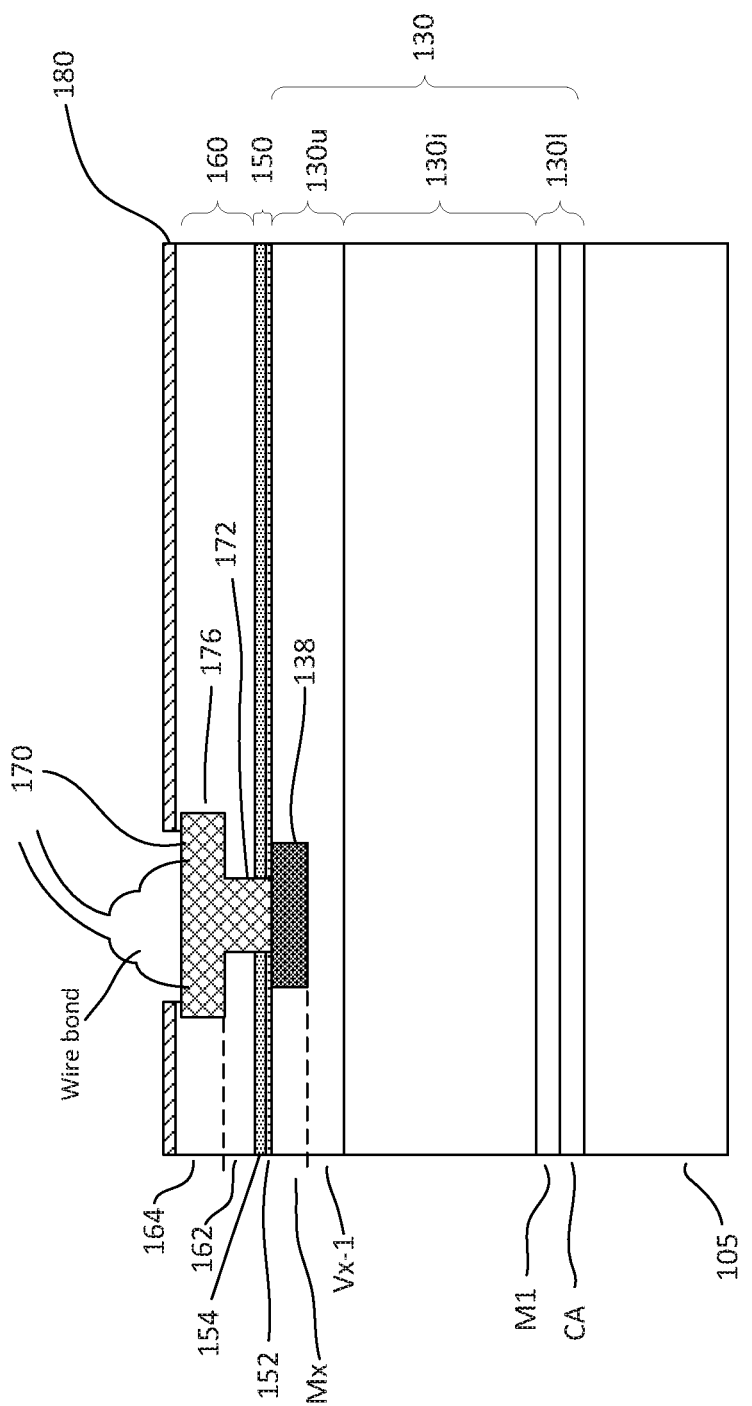
FIG. 3 shows a cross-sectional view of another embodiment of a device.

FIG. 3 shows another embodiment of a device. The device 300, for example, is an integrated circuit (IC). Other types of devices may also be useful. The device is similar to that described in FIG. 1 and FIGS. 2a-2b. Common elements and features having the same reference numerals may not be described or described in detail.

The device includes a substrate 105. The substrate may include various types of regions, such as HV, memory and logic regions. Other suitable types of devices or device regions may also be useful. The substrate includes transistors on the substrate. Other suitable types of components may also be provided on the substrate. Disposed on the substrate over the transistors are ILD layers 130. For example, ILD layers 1-x are provided over the substrate over the transistors.

A pad level 160 is disposed over the upper ILD level. A protection layer 150 is provided between the upper ILD level 130u and the pad level 160. For illustration purpose, the protection layer includes first and second sub-layers 152 and 154. It is understood that the protection layer may be a single protection layer. For example, the protection layer includes a nitride layer. Other suitable configurations and materials for the protection layer may also be useful. The pad level includes lower and upper pad levels 162 and 164. In one embodiment, the lower pad level is a silicon oxide layer and the upper pad level is a SOG layer. Other suitable configurations of the pad dielectric layers may also be useful.

A pad interconnect 170 is disposed in the pad layer. The interconnect includes a pad via contact 172 in the pad via level and a contact pad 176 in the pad contact level. The pad interconnect, in one embodiment, is an Al pad interconnect. Other suitable conductive materials, such as but not limited to Cu, may also be used to serve as the pad interconnect. In one embodiment, the pad via contact and the contact pad may be formed of the same material. For example, the pad via contact and contact pad may be formed of Al. Forming the pad interconnect of different materials, such as but not limited to Cu, may also be useful. In one embodiment, the pad via contact and contact pad are formed using separate processes. In one embodiment, the pad via contact is formed by a damascene process and the contact pad is formed by a RIE process. Forming the pad via contact and contact pad by other suitable types of processes may also be useful.

A top surface of the pad dielectric layer 160 is almost or substantially coplanar with a top surface of the pad interconnect 170. As shown in FIG. 3, the top surface of the pad dielectric layer 160 is slightly above the top surface of the pad interconnect 170. The top surface of the pad dielectric layer 160, in one embodiment, is planar. Providing a pad dielectric layer having a planar top surface above the pad interconnect avoids a step in the passivation layer 180. This reduces stress related defects to the passivation layer. In one embodiment, the top surface of the pad dielectric layer is about 2000-4000 Å above the pad interconnect. Providing a pad dielectric layer having other suitable thickness above the pad interconnects which reduces stress related defects in the passivation layer may also be useful.

In alternative embodiments, the top surface of the pad dielectric layer may be coplanar with the pad interconnect, as shown in FIG. 1. In other embodiments, the top surface of the pad dielectric layer may be slightly below the top surface of the pad interconnect, as shown in FIG. 2a.

A passivation layer 180 is disposed over the surface of the pad dielectric layer. The passivation layer is used for preventing pad surface from oxidation/corrosion and contamination during wire bonding and packaging process. The passivation layer, in one embodiment, is a silicon nitride layer. Other suitable types of passivation layers may also be useful. The passivation layer may be, for example, about 5000 Å thick. Other suitable thicknesses may also be useful.

FIGS. 4a-4g show a process 400 for forming an embodiment of a device. The process, for example, is employed in forming a device, such as that shown in FIG. 1. Common elements and features having the same reference numerals may not be described or described in detail.

Figure 4A:
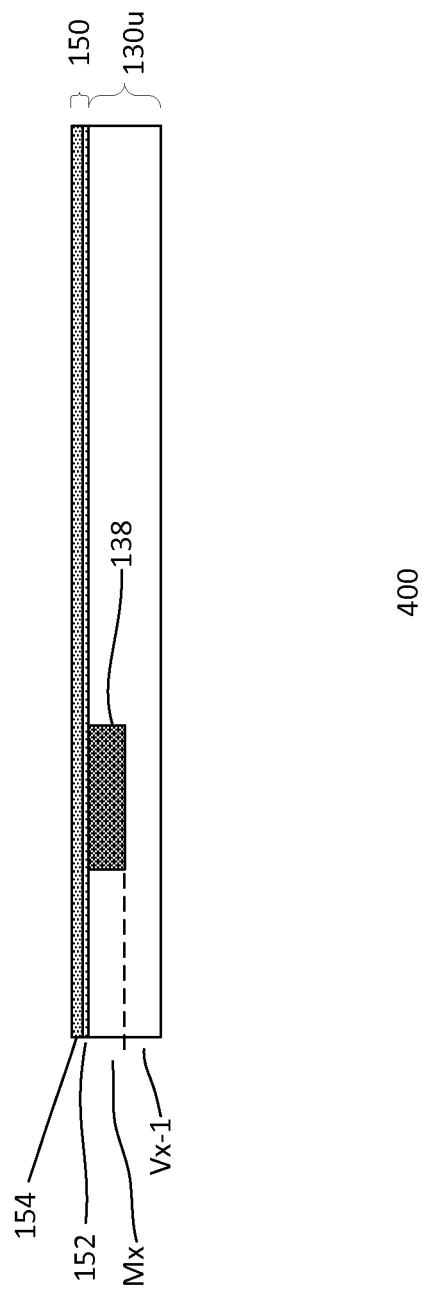

Referring to FIG. 4a, an upper ILD level 130u is provided. The upper ILD level, for example, includes Mx and Vx−1 levels. As previously described, the upper ILD level is provided over intermediate and lower ILD levels (not shown) on a substrate (not shown) formed by BEOL processes. The ILD levels are disposed on a substrate prepared with transistors formed by FEOL processes. The metal level Mx includes at least one interconnect 138.

A protection layer 150 is formed on the upper ILD level. The protection layer is a dielectric layer. In one embodiment, the protection layer is a dielectric protection layer stack with lower and upper protection layers or sub-layers 152 and 154. The lower protection layer is a nBLOK layer and the upper protection layer is a nitride layer. The protection layer, for example, may serve as an etch stop layer and protect Cu from diffusion/oxidation. The layers of the protection stack may be formed by, for example, CVD. Forming the layers of the protection stack using other suitable techniques may also be useful. The thickness of the lower protection layer 152 may be about 1000 Å while the upper protection layer 154 may be about 2000 Å thick. Other suitable types of protection layers or thicknesses may also be useful. In some embodiment, the protection layer may be a single layer. For example, the protection layer may be a silicon nitride layer.

Figure 4B:
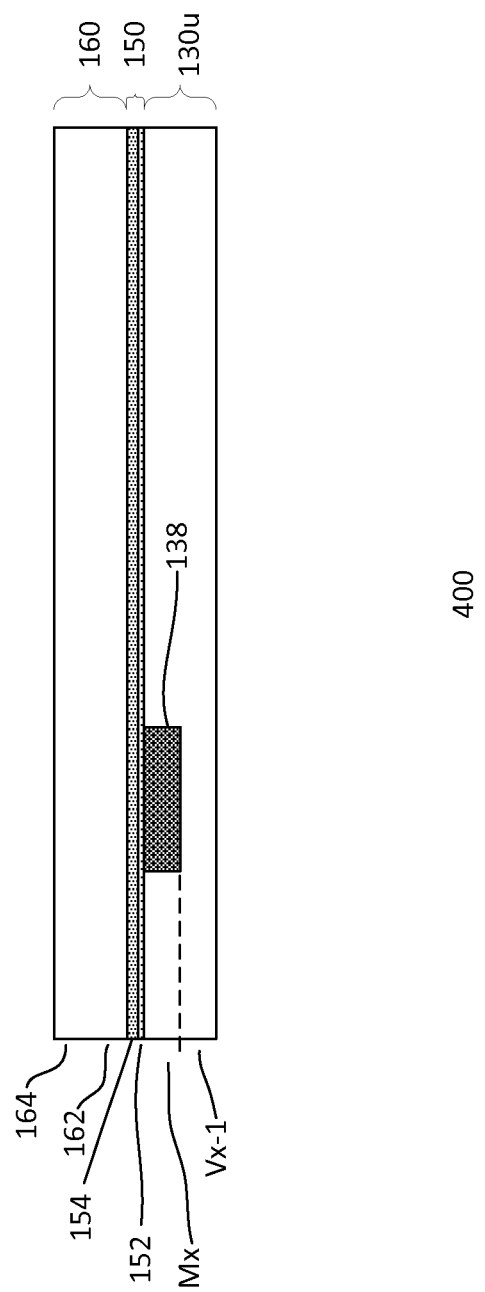

In FIG. 4b, a pad dielectric layer 160 is formed on the substrate over the upper ILD level 130u. In one embodiment, the pad dielectric layer is formed on the protection layer over the upper ILD layer. The pad dielectric layer includes lower and upper pad dielectric levels 162 and 164. The pad dielectric layer, in one embodiment, is a silicon oxide layer. Other suitable types of pad dielectric layers may also be useful. The thickness of the pad dielectric layer may be about 3 μm. Other suitable thicknesses may also be useful. The thickness, for example, may depend on the technology. The pad dielectric layer may be formed by, for example, CVD. Other suitable techniques for forming the pad dielectric layer may also be useful. In one embodiment, the pad dielectric layer is a single layer. Providing a pad dielectric layer with multiple layers, including etch stop layers may also be useful. In the case of multiple layers, the layers may be formed of different dielectric materials or layers.

Figure 4C:
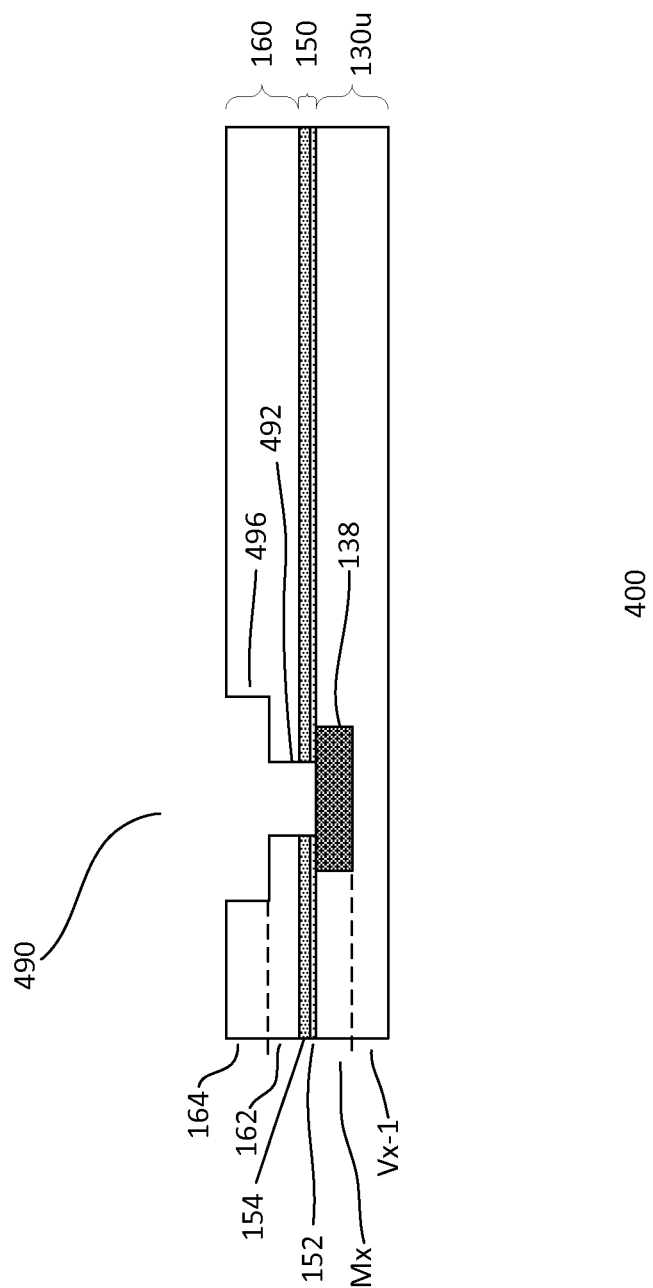

The process continues to form a dual damascene structure 490 in the pad dielectric layer 160, as shown in FIG. 4c. The dual damascene structure includes a via contact opening 492 in the lower dielectric level 162 and a contact pad opening 496 in the upper pad dielectric level 164. The via contact opening extends through the protection layer, exposing the interconnect 138 in the metal level Mx of the upper ILD level.

Forming the dual damascene structure may be achieved by mask and etch techniques. For example, a mask, such as photoresist, is formed on the pad dielectric layer. An exposure source may selectively expose the photoresist layer through a reticle containing the desired pattern. After selectively exposing the photoresist layer, it is developed to pattern the photoresist layer. To improve lithographic resolution, an anti-reflective coating (not shown) may be used below the photoresist layer. The patterned mask layer is used to pattern the pad dielectric layer. For example, an anisotropic etch, such as RIE, is used to remove exposed portion of the pad dielectric layer. Other types of etch processes may also be useful. The etch transfers the pattern of the mask layer to the underlying layers. In the case of via first process, the pattern corresponds to the pad via contact opening. The etch also removes the underlying protection layer to expose the interconnect in Mx. The patterned mask is removed after the etch. Another patterned mask is provided on the upper ILD layer. The pattern of the mask corresponds to the contact pad opening. An etch, such as RIE, is performed to form the contact pad opening. In the case of a trench first process, the contact pad opening is first formed followed by forming the via contact opening. Other suitable techniques for forming the dual damascene structure may also be useful.

Figure 4D:
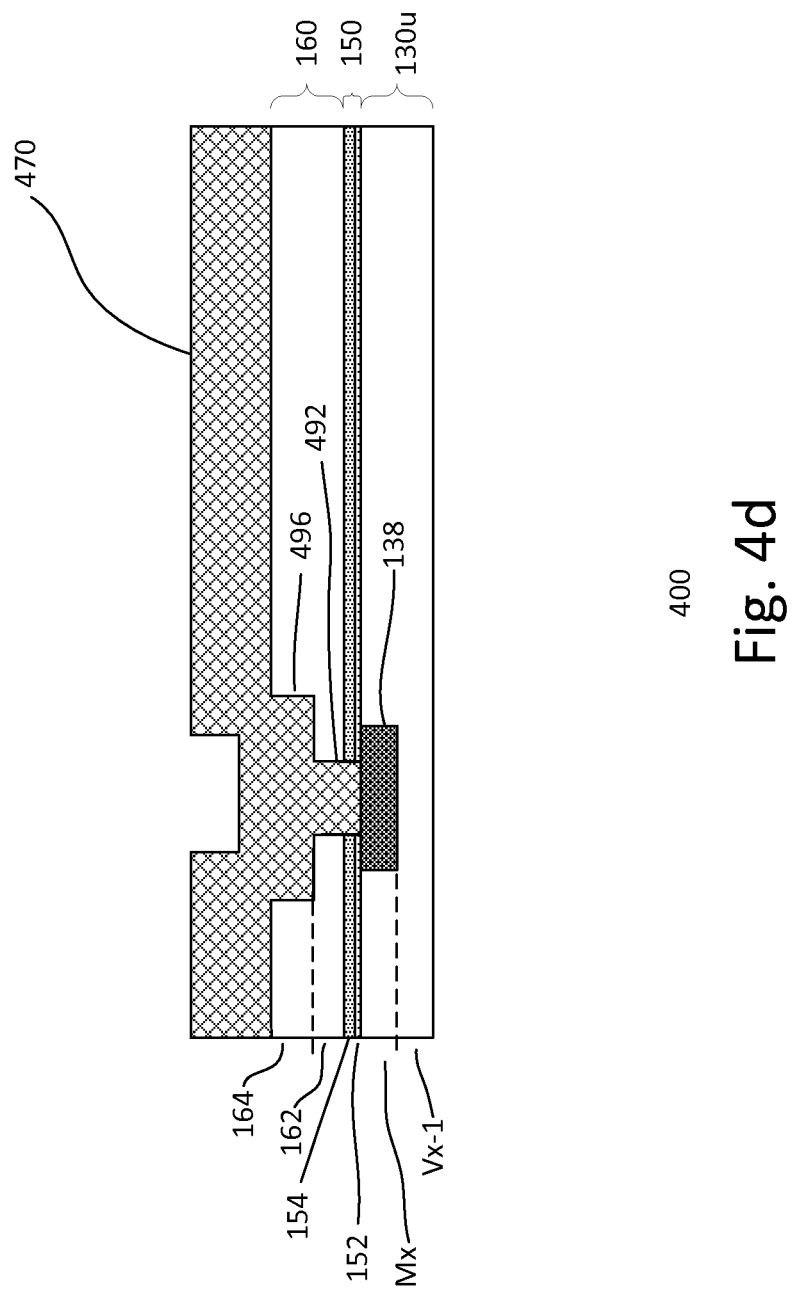

Referring to FIG. 4d, a conductive layer 470 is formed on the substrate, filling the dual damascene structure 490. The conductive layer, in one embodiment, is an Al layer. Other suitable types of conductive layers, such as but not limited to Cu layer, may also be useful. The conductive layer may be formed by, for example, sputtering. Other suitable techniques, such as electrochemical plating, may also be used to form the conductive layer.

As shown in FIG. 4e, a planarization process is performed to remove excess conductive material to form the pad interconnect 170 having a contact pad 176 and pad via contact 172. The planarization process, in one embodiment, includes CMP. Other suitable types of planarization processes may also be useful. The planarization process, as shown, results in a top coplanar surface between the pad interconnect and pad dielectric layer. The dual damascene structure and the planarization process enables a flat pad interconnect surface to be formed.

Figure 4F:
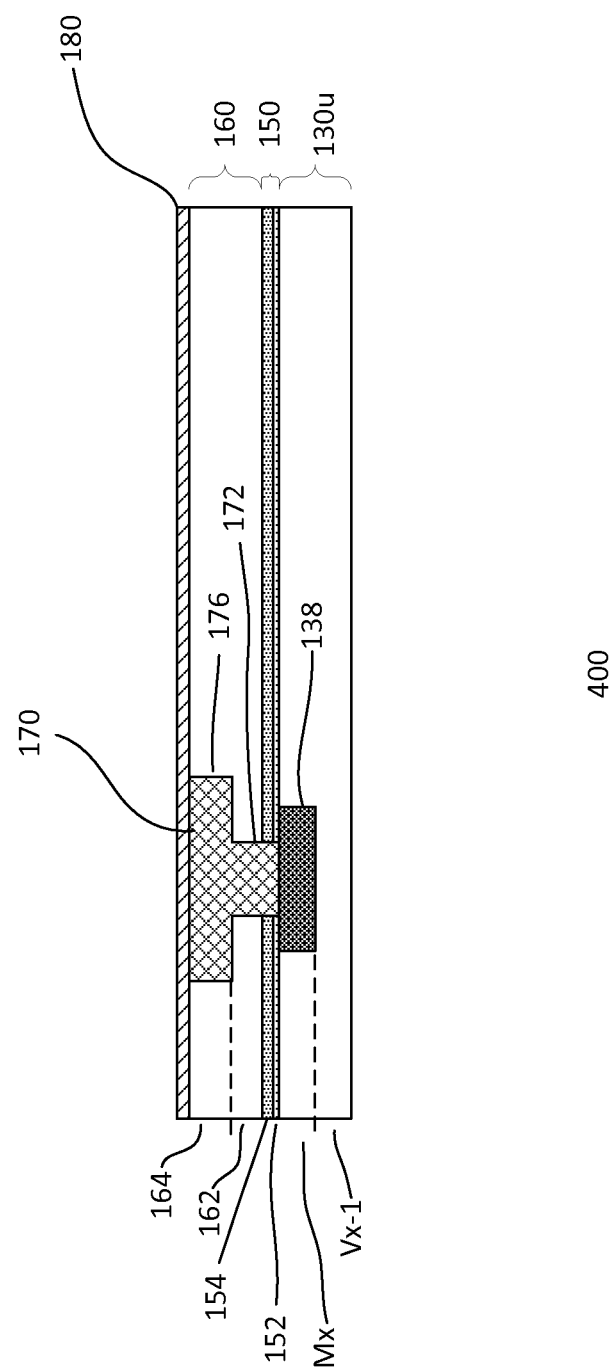

In FIG. 4f, a passivation layer 180 is formed on the substrate, covering the pad dielectric layer and pad interconnect. The passivation layer, in one embodiment, is a silicon nitride layer. Other suitable types of passivation layers may also be useful. The passivation layer may be formed by CVD. Forming the passivation layer using other suitable techniques may also be useful. The thickness of the passivation layer may be about 5000 Å. Other suitable thicknesses may also be useful.

Referring to FIG. 4g, the passivation layer is patterned to form an opening 185 to expose the pad interconnect 170. The passivation layer, as shown, overlaps the pad interconnect. Patterning the passivation layer may be achieved using mask and etch techniques. For example, a patterned soft mask, such as a photoresist mask, is used to pattern the passivation layer by RIE. Other suitable techniques for patterning the passivation layer may also be useful.

The process continues to complete forming the device. For example, the substrate or wafer on which devices are formed in parallel are diced to singulate the devices or chips. The chips are then assembled. Assembly, for example, includes wire bonding the chips to lead frames. The assembled chips are then packaged.

FIGS. 5a-5g show another process 500 for forming an embodiment of a device. The process, for example, is similar to that described in FIGS. 4a-4g and is employed in forming devices, such as the device shown in FIG. 2a. Common elements and features having the same reference numerals may not be described or described in detail.

Figure 5A:
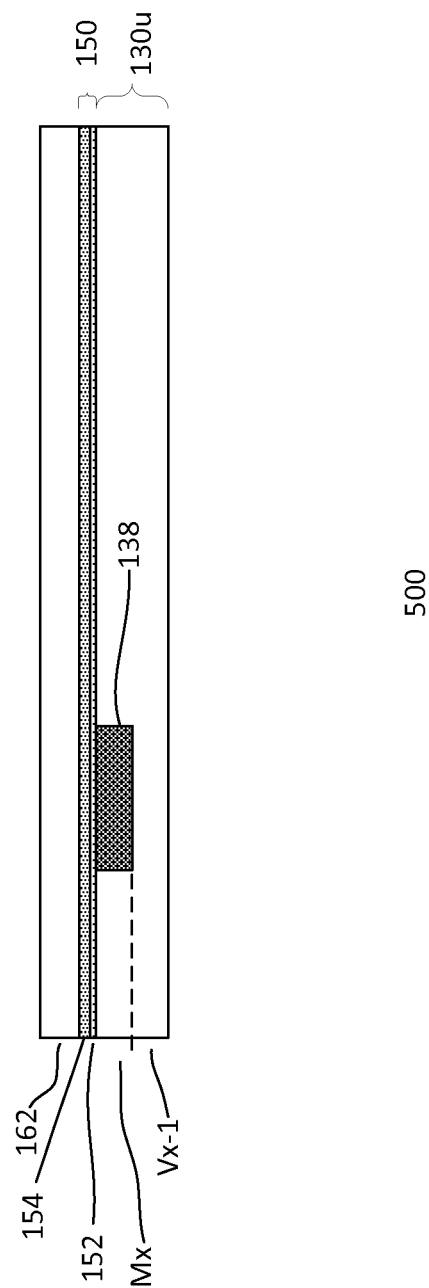

Referring to FIG. 5a, an upper ILD level 130u is provided. The upper ILD level, for example, is provided on a processed substrate with lower and intermediate ILD layers. The metal level Mx of the upper ILD level includes at least one interconnect 138. A protection layer 150 is formed on the upper ILD level. In one embodiment, the protection layer is a dielectric protection layer stack with lower and upper protection layers or sub-layers 152 and 154. The lower protection layer is a nBLOK layer and the upper protection layer is a nitride layer. In one embodiment, a protection layer 150 includes a single layer, for example, a nitride layer. Other suitable protection layer may also be useful.

In one embodiment, a lower pad dielectric layer 162 is formed on the substrate over the upper ILD level. In one embodiment, the lower pad dielectric layer is formed on the protection layer over the upper ILD layer. The lower pad dielectric layer, in one embodiment, is a silicon oxide layer. Other suitable types of lower pad dielectric layers may also be useful. The thickness of the lower pad dielectric layer may be about 5000 Å. Other suitable thicknesses may also be useful. The thickness, for example, may depend on the technology. The lower pad dielectric layer may be formed by, for example, CVD. Other suitable techniques for forming the lower pad dielectric layer may also be useful. In one embodiment, the pad dielectric layer is a single layer.

Figure 5B:
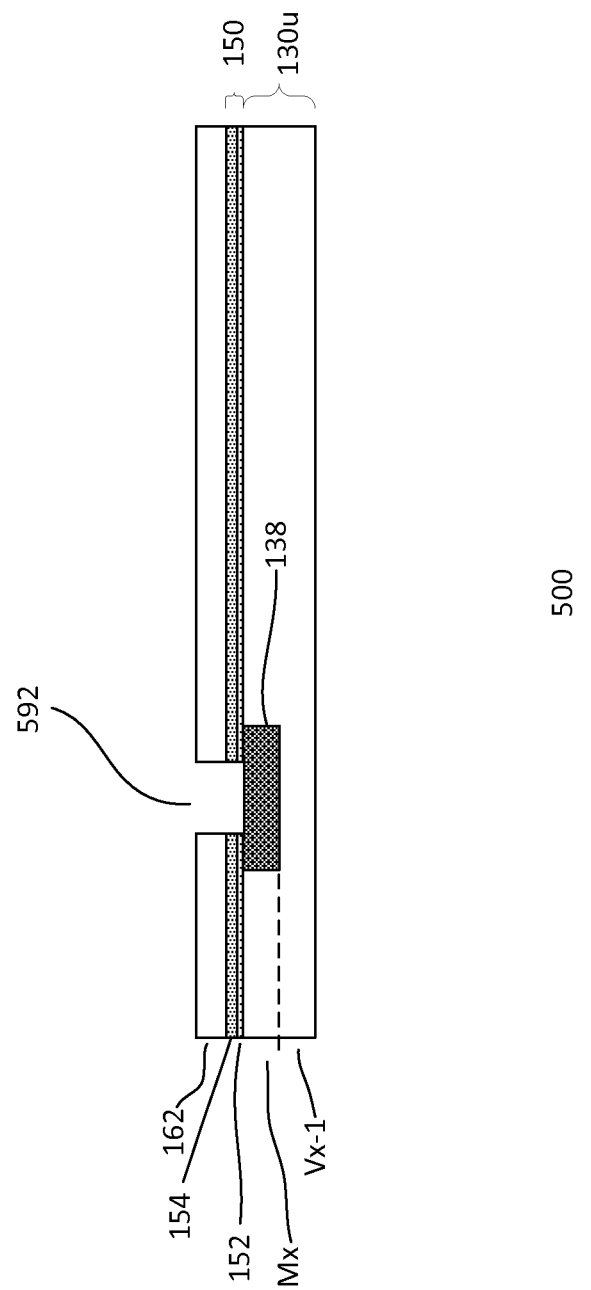

In FIG. 5b, a pad via contact opening 592 is formed in the lower pad dielectric layer. The via contact opening, for example, is formed by mask and etch techniques. For example, a patterned mask layer, such as photoresist, is used as an etch mask for a RIE process. The RIE removes exposed dielectric material and protection layer, exposing the interconnect 138 in Mx.

Figure 5C:
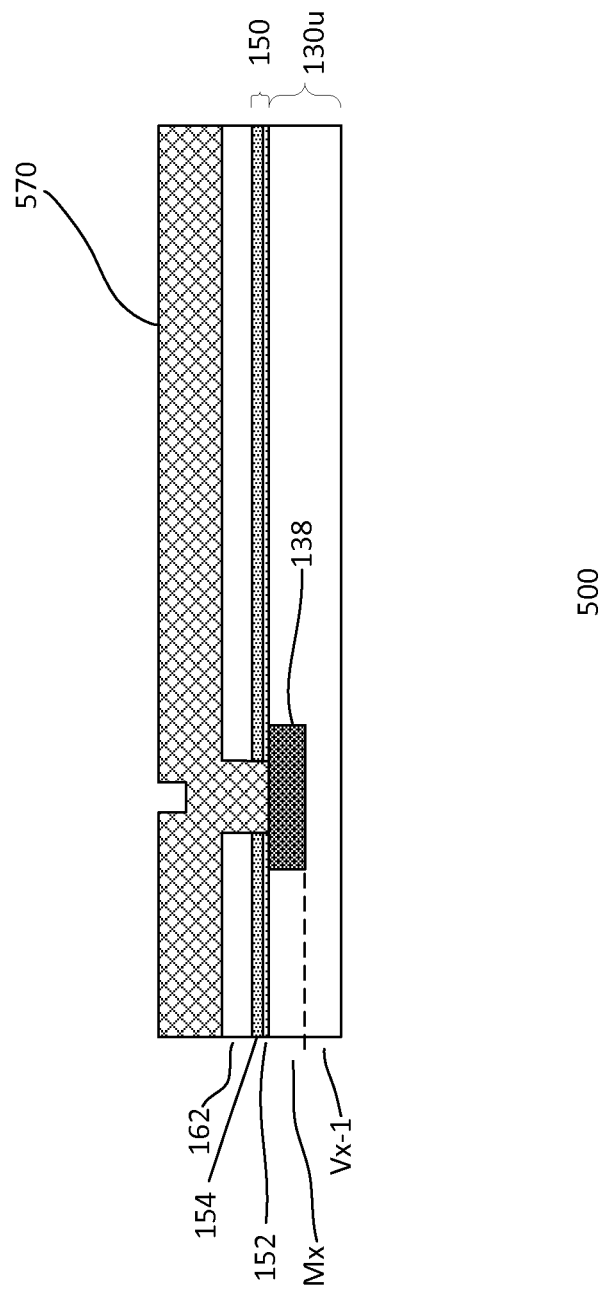

Referring to FIG. 5c, a conductive layer 570 is formed on the substrate, filling the via opening and covering the lower pad dielectric layer. The conductive layer, in one embodiment, is an Al layer. Other suitable types of conductive layers, such as but not limited to Cu layer, may also be useful. The conductive layer should be sufficiently thick to form a contact pad. The conductive layer may be formed by, for example, sputtering. Other suitable techniques, such as electrochemical plating, may also be useful to form the conductive layer.

Referring to FIG. 5d, the conductive layer is patterned to form a pad interconnect 170 having a contact pad 176 and a pad via contact 172. The conductive layer is patterned using mask and etch techniques. For example, a patterned mask is used by a RIE to remove exposed portions of the conductive layer, leaving a contact pad 176 over the lower pad dielectric layer 162.

In FIG. 5e, an upper pad dielectric layer 564 is formed on the substrate. The upper pad dielectric layer covers the lower pad dielectric layer and contact pad. In one embodiment, the upper pad dielectric layer includes a SOG layer. The SOG layer is formed by a spin-on process. The SOG is essentially a self-planarizing layer. In one embodiment, the thickness of the SOG layer is equal to the thickness of the upper pad dielectric layer. The SOG layer includes a thin portion covering the contact pad (due to SOG's viscosity property), creating a small step in the surface profile. Other suitable flowable materials, such as PETEOS/BPSG, polyimide or a combination of dielectric layers may also be useful.

Figure 5F:
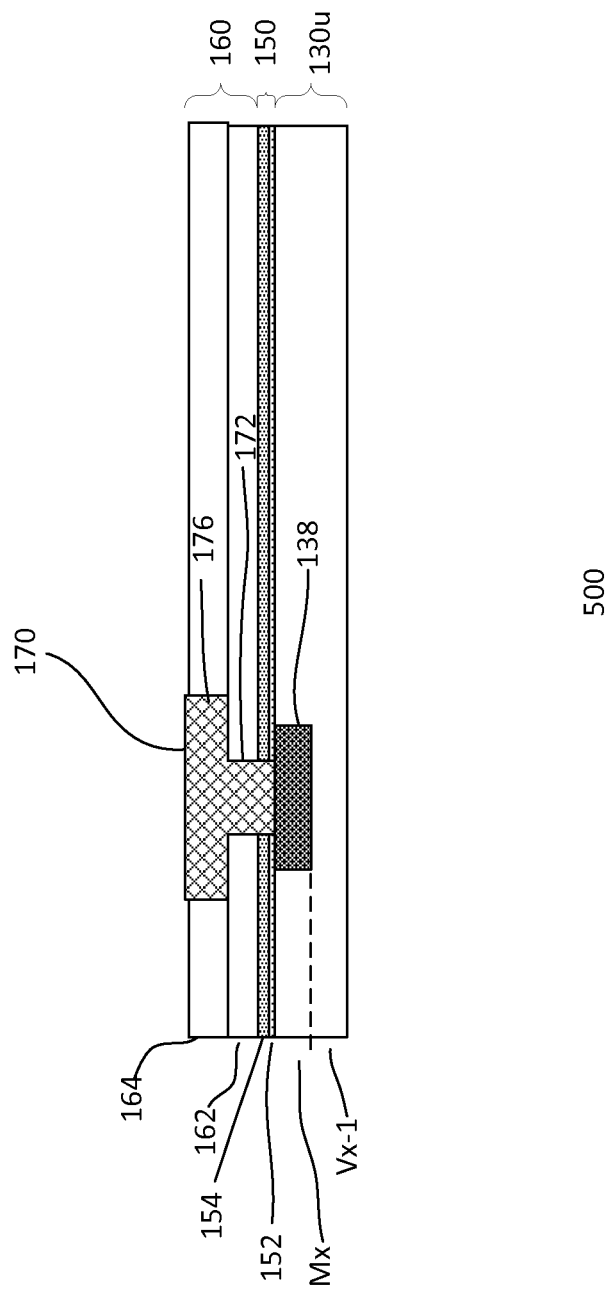

As shown in FIG. 5f, the thin portion of the SOG layer is removed by, for example, CMP or RIE. Other suitable types of removal process may also be useful. The CMP or RIE removes the portion of the SOG layer over the contact pad. In one embodiment, the removal process may also cause top surface of the upper pad dielectric layer to be slightly below the top surface of the contact pad. This creates a small step profile between the upper pad dielectric layer and contact pad. For example, the height of the step or the height difference between the top surfaces of the upper pad dielectric layer and the contact pad is about than 2000-4000 Å. Other suitable height or thickness difference which reduces stress related defects in the passivation layer may also be useful.

Figure 5G:
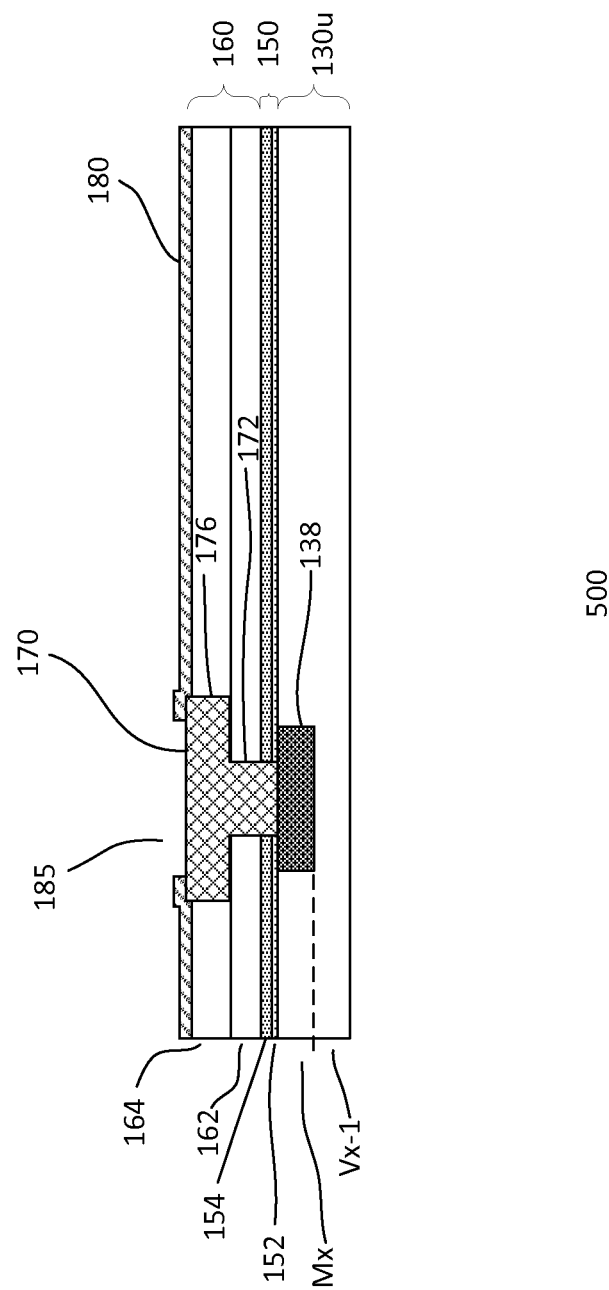

Referring to FIG. 5g, a passivation layer 180 is formed on the substrate, covering the pad dielectric layer and pad interconnect. The passivation layer, in one embodiment, is a silicon nitride layer. Other suitable types of passivation layers may also be useful. The passivation layer may be formed by CVD. Forming the passivation layer using other suitable techniques may also be useful. The thickness of the passivation layer may be about 5000 Å. Other suitable thicknesses may also be useful. The passivation layer is a conformal layer, following the underlying surface profile. However, since the step is small, stress related defects, such as delamination or cracking, are significantly reduced or avoided in the passivation layer.

The passivation layer is patterned to form an opening 185 to expose the pad interconnect. The passivation layer, as shown, overlaps the pad interconnect. Patterning the passivation layer may be achieved using mask and etch techniques. For example, a patterned soft mask, such as a photoresist mask, is used to pattern the passivation layer by RIE. Other suitable techniques for patterning the passivation layer may also be useful.

The process may continue to complete forming the device. For example, the substrate or wafer on which devices are formed in parallel are diced to singulate the devices or chips. The chips are then assembled. Assembly, for example, includes wire bonding the chips to lead frames. The assembled chips are then packaged.

Figure 6A:
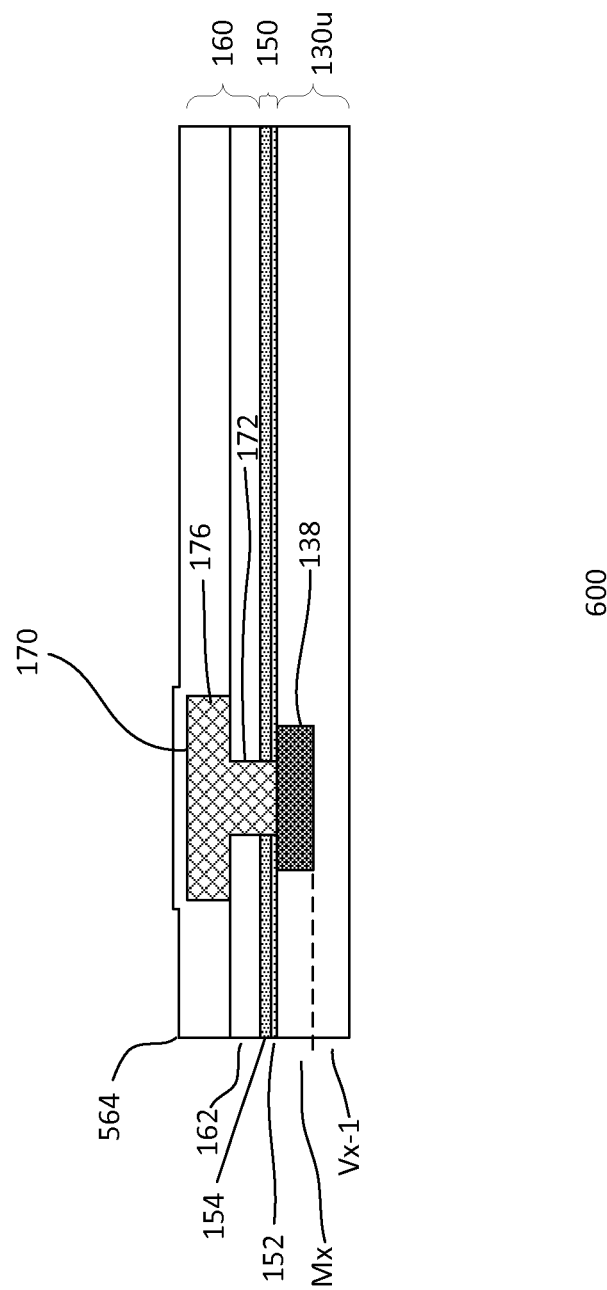

FIGS. 6a-6b show yet another process 600 for forming an embodiment of a device. The process 600, for example, is similar to that described in FIGS. 4a-4g and FIGS. 5a-5g and is used to form devices such as the device shown in FIG. 2b. Common elements and features having the same reference numerals may not be described or described in detail.

Referring to FIG. 6a, a substrate is shown at the stage of processing as described in FIG. 5e. For example, an upper pad dielectric layer 564 is formed on the substrate. The upper pad dielectric layer covers the lower pad dielectric layer 162 and contact pad 170. In one embodiment, the upper pad dielectric layer includes a SOG layer. Other suitable flowable materials, such as PETEOS/BPSG, polyimide or a combination of dielectric layers may also be useful. The SOG layer is formed by a spin-on process. The SOG is essentially a self-planarizing layer. In one embodiment, the thickness of the SOG layer is equal to the thickness of the upper pad dielectric layer. The SOG layer includes a thin portion covering the contact pad (due to SOG's viscosity property) creating a small step in the surface profile. In one embodiment, the step is small. For example, the height of the step is about 2000-4000 Å. Other suitable height or thickness difference which reduces stress related defects in the passivation layer may also be useful.

As shown in FIG. 6b, a passivation layer 180 is formed on the substrate, covering the pad dielectric layer. The passivation layer, in one embodiment, is a silicon nitride layer. Other suitable types of passivation layers may also be useful. The passivation layer may be formed by CVD. Forming the passivation layer using other suitable techniques may also be useful. The thickness of the passivation layer may be about 5000 Å. Other suitable thicknesses may also be useful. The passivation layer is a conformal layer, following the underlying surface profile.

The passivation layer and the upper pad dielectric layer are patterned to form an opening 185 to expose the pad interconnect. The passivation layer, as shown, partially overlaps the pad interconnect. The overlap portions include the underlying upper pad dielectric layer over the contact pad. Patterning the passivation and upper pad dielectric layers may be achieved using mask and etch techniques. For example, a patterned soft mask, such as a photoresist mask is used to pattern the passivation and upper pad dielectric layers by RIE. Other suitable techniques for patterning the passivation and upper pad dielectric layers may also be useful. The process as described in FIGS. 6a-6b, for example, allows for a much reduced final step height to be achieved. Since the step height is small or significantly reduced, stress related defects, such as delamination or cracking, are significantly reduced or avoided in the passivation layer.

The process may continue to complete forming the device. For example, the substrate or wafer on which devices are formed in parallel are diced to singulate the devices or chips. The chips are then assembled. Assembly, for example, includes wire bonding the chips to lead frames. The assembled chips are then packaged.

FIGS. 7a-7e show another process 700 for forming an embodiment of a device. The process 700, for example, is similar to that described in FIGS. 4a-4g, FIGS. 5a-5g and FIGS. 6a-6b and is used to form a device such as that shown in FIG. 3. Common elements and features having the same reference numerals may not be described or described in detail.

Referring to FIG. 7a, a substrate is shown at the stage of processing as described in FIG. 5d. For example, a conductive layer over the lower pad dielectric layer is patterned to form a contact pad 176. This, for example, forms the pad interconnect 170.

As shown, in FIG. 7b, an upper pad dielectric layer 764 is formed on the substrate. The upper pad dielectric layer covers the lower pad dielectric layer 162 and contact pad 170. In one embodiment, the upper pad dielectric layer includes a SOG layer. Other suitable flowable materials, such as PETEOS/BPSG, polyimide or a combination of dielectric layers may also be useful. The SOG layer is formed by a spin-on process. In one embodiment, the thickness of the SOG layer is greater than the thickness of the upper pad dielectric layer. Although the SOG is essentially a self-planarizing layer, it includes a small step over the contact pad.

Figure 7C:
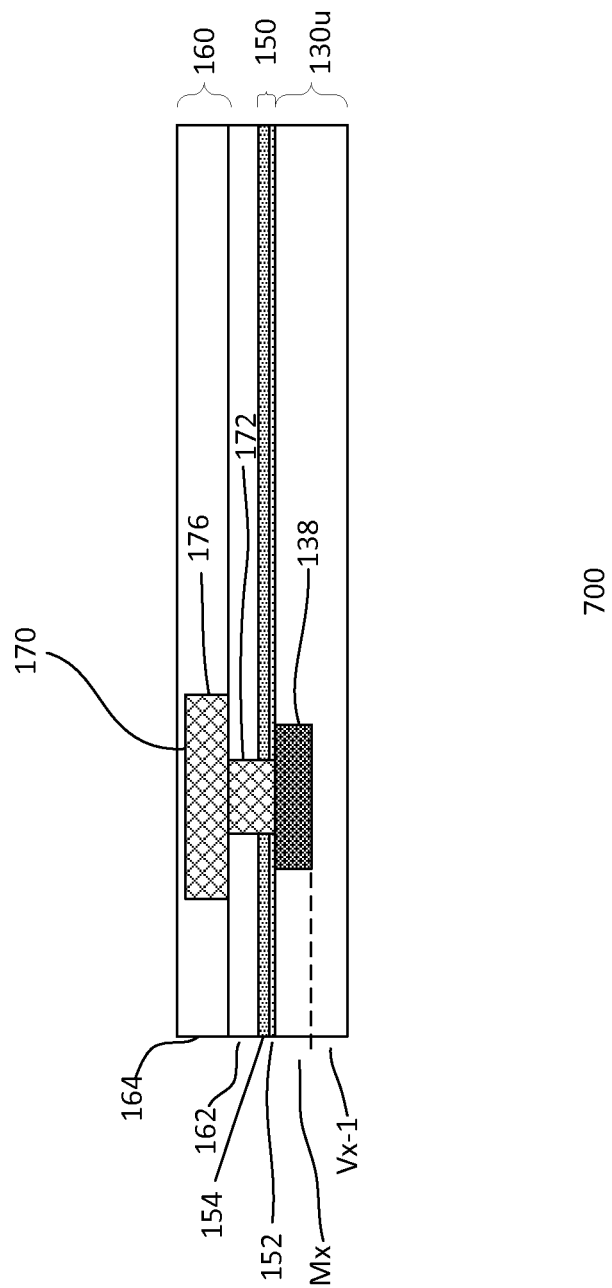

In FIG. 7c, the substrate is planarized by, for example, CMP. Other suitable types of planarization process may also be useful. The CMP reduces the thickness of the upper pad dielectric layer to the desired thickness. The CMP produces a planar top surface, leaving a thin upper dielectric layer over the contact pad. The thickness of the upper dielectric layer over the contact pad, for example, is about 2000-4000 Å. Other suitable thicknesses which reduce stress related defects in the passivation layer may also be useful.

Figure 7D:
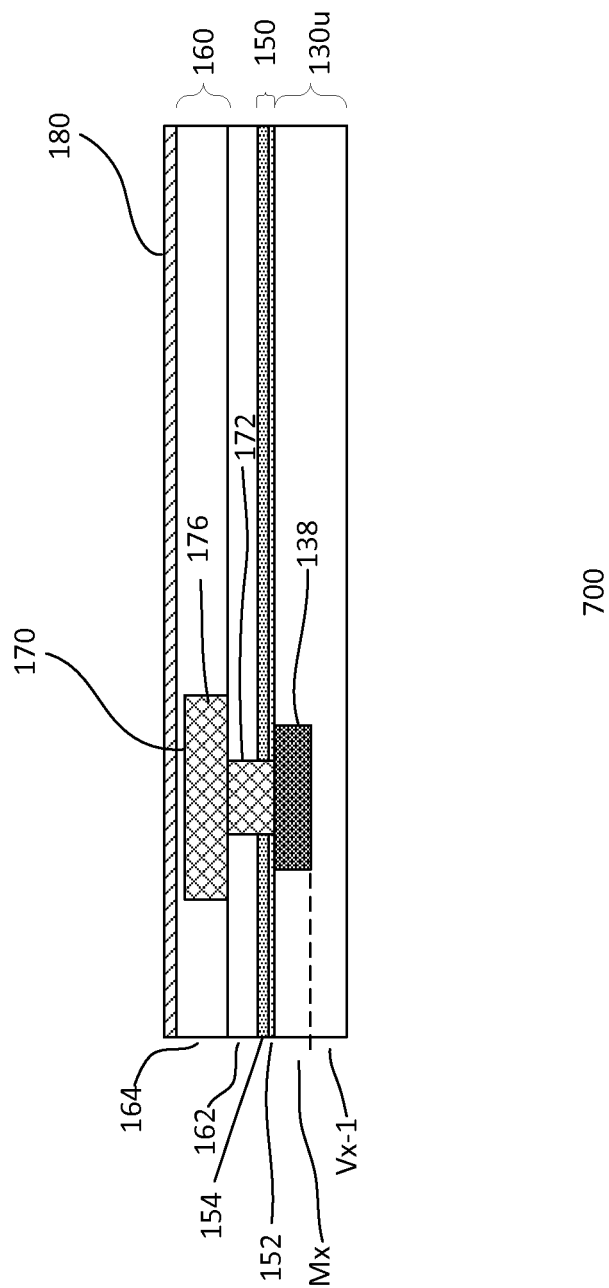

Referring to FIG. 7d, a passivation layer 180 is formed on the substrate, covering the pad dielectric layer. The passivation layer, in one embodiment, is a silicon nitride layer. Other suitable types of passivation layers may also be useful. The passivation layer may be formed by CVD. Forming the passivation layer using other suitable techniques may also be useful. The passivation layer, as shown, has no step due to the underlying planar topography. This reduces stress related defects to the passivation layer.

The passivation and the upper pad dielectric layers, as shown in FIG. 7e, are patterned to form an opening 185 to expose the pad interconnect. The passivation layer, as shown, partially overlaps the pad interconnect. The overlap portions include the underlying upper pad dielectric layer over the contact pad. Patterning the passivation layer may be achieved using mask and etch techniques. For example, a patterned soft mask, such as a photoresist mask, is used to pattern the passivation and upper pad dielectric layers by RIE. Other suitable techniques for patterning the passivation and upper pad dielectric layers may also be useful. The process as described in FIGS. 7a-7e, for example, enables the final surface of the passivation and pad dielectric layer to be planar. Thus, stress related defects, such as delamination or cracking, are significantly reduced or avoided in the passivation layer.

In alternative embodiments, the CMP process of FIG. 7c may stop on the top surface of the contact pad, producing a co-planar surface between the contact pad and upper pad dielectric layer. In such case, the CMP avoids a step profile in the upper dielectric layer. This forms a device similar to that described in FIG. 1. In other embodiments, the CMP process may cause the top surface of the upper pad dielectric layer to be slightly below the top surface of the contact pad. This produces a device similar to that described in FIG. 2a.

The process may continue to complete forming the device. For example, the substrate or wafer on which devices are formed in parallel are diced to singulate the devices or chips. The chips are then assembled. Assembly, for example, includes wire bonding the chips to lead frames. The assembled chips are then packaged.

The embodiments as described result in advantages. As described, a top surface of the pad dielectric layer is almost or substantially coplanar with a top surface of the pad interconnect. For example, the top surface of the pad dielectric layer may be coplanar, slightly above or slightly below the top surface of the pad interconnect. This prevents the passivation layer which is disposed over the contact pad of the pad interconnect from cracking or delaminating from the pad dielectric layer. In some of the embodiments, the use of flowable dielectric material to form the upper pad dielectric layer is advantageous as it enables flatter bond pad surface to be formed, avoiding any stress induced delamination or cracking. In addition, some embodiments use planarization technique, such as CMP, to form a flat contact pad of the pad interconnect or a flat upper pad dielectric surface. This eliminates the risk of low bump yield due to poor under bump metallization (UBM) gap fill. Further, the embodiments as described avoid undesired bump residues in the passivation layer. Thus, the reliability of the wire bond pad structures is ensured. Moreover, the substantially flat pad interconnect surface and passivation layer allows thicker contact pads to be formed. This enables more versatile redistribution layer (RDL) routing.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having circuit component and a dielectric layer over the substrate, wherein the dielectric layer comprises a plurality of inter level dielectric (ILD) layers and the uppermost dielectric layer comprises at least one interconnect;
   a pad dielectric layer which comprises a flowable dielectric material disposed over the uppermost ILD layer;
   a pad interconnect which is a wire bond pad configured for receiving a wire bond disposed in the pad dielectric layer and a top surface of the pad interconnect is exposed such that the wire bond is to be attached and in direct contact thereto, wherein the pad interconnect is coupled to the at least one interconnect of the uppermost ILD layer, wherein a top surface of the pad dielectric layer is substantially coplanar with a top surface of the pad interconnect; and
   a passivation layer disposed over and in direct contact with the pad dielectric layer, wherein the passivation layer comprises a non-planar top surface having a first height closer to the pad interconnect and a second height away from the pad interconnect, wherein the first height is slightly higher than the second height, and the passivation layer is used for preventing a top surface of the pad interconnect from oxidation/corrosion and contamination during wire bonding and packaging process.

2. The device of claim 1 wherein the top surface of the pad dielectric layer is slightly below the top surface of the pad interconnect.

3. The device of claim 1 wherein the top surface of the pad dielectric layer adjacent to the pad interconnect is slightly above the top surface of the pad interconnect.

4. The device of claim 3 wherein the top surface of the pad dielectric layer comprises a first height and a second height away from the pad interconnect, and wherein the first height is slightly higher than the second height.

5. The device of claim 4 wherein the passivation layer comprises a step profile.

6. A method for forming a device comprising:
   providing a substrate having circuit component and a dielectric layer over the substrate, wherein the dielectric layer comprises a plurality of inter level dielectric (ILD) layers and the uppermost dielectric layer comprises at least one interconnect;
   providing a pad dielectric layer over the uppermost ILD layer, wherein providing the pad dielectric layer comprises forming a lower pad dielectric layer over the uppermost dielectric layer, and forming an upper pad dielectric layer over the lower pad dielectric layer, wherein the upper pad dielectric layer comprises a flowable dielectric material;

forming a pad interconnect which is a wire bond pad configured for receiving a wire bond in the pad dielectric layer and a top surface of the pad interconnect is exposed such that the wire bond is to be attached and in direct contact thereto, wherein the pad interconnect is coupled to the at least one interconnect of the uppermost ILD layer, wherein a top surface of the pad dielectric layer is substantially coplanar with a top surface of the pad interconnect; and forming a passivation layer over and in direct contact with the pad dielectric layer, wherein the passivation layer comprises a first portion covering the pad interconnect having a first height and a second portion not covering the pad interconnect having a second height, wherein the first height is same as the second height, and wherein the passivation layer is used for preventing a top surface of the pad interconnect from oxidation/corrosion and contamination during wire bonding and packaging process.

7. The method of claim 6 wherein the flowable dielectric material comprises a spin on glass (SOG) layer formed by spin on process.

8. The method of claim 6 wherein the flowable dielectric material comprises PETEOS/BPSG, polyimide or a combination thereof.

9. The method of claim 7 wherein forming the pad interconnect comprises:
forming a pad via contact opening in the lower pad dielectric layer;
forming a conductive layer on the substrate, wherein the conductive layer fills the pad via opening and covering the lower pad dielectric layer; and
patterning the conductive layer to form the pad interconnect having a contact pad over the lower pad dielectric layer and a pad via contact in the pad via opening.

10. The method of claim 9 wherein:
forming the pad dielectric layer comprises forming the upper pad dielectric layer covering the lower pad dielectric layer and the contact pad, wherein the upper pad dielectric layer comprises a thin portion covering the contact pad, creating a step surface profile; and comprising
patterning the passivation layer and upper pad dielectric layer to expose a top surface of the contact pad, wherein each of the passivation layer and upper dielectric layer comprises a non-planar top surface having a first height closer to the pad interconnect and a second height away from the pad interconnect, wherein the first height is slightly higher than the second height.

11. The method of claim 9 comprising removing a portion of the upper pad dielectric layer to expose top surface of the contact pad and causes the top surface of pad dielectric layer to be slightly below the top surface of the pad interconnect.

12. The method of claim 11 wherein the flowable dielectric material comprises PETEOS/BPSG, polyimide or a combination thereof.

13. The method of claim 9 wherein:
forming the passivation layer is performed after forming the upper pad dielectric layer; and comprising
patterning the passivation layer and upper pad dielectric layer to expose a top surface of the contact pad.

14. The method of claim 9 comprising:
performing a planarization process to reduce thickness of the upper pad dielectric layer to a desired thickness, wherein the planarization process forms a planar top surface, leaving a thin upper dielectric layer over the contact pad; and wherein forming the passivation layer is performed after performing the planarization process.

15. The method of claim 14 comprising patterning the passivation and upper pad dielectric layers to expose a top surface of the contact pad, wherein the top surfaces of the pad dielectric layer and the passivation layer are planar.

16. The method of claim 9 wherein:
forming the upper pad dielectric layer comprises forming the SOG layer covering the lower pad dielectric layer and the contact pad, creating a step surface profile; and comprising
performing a planarization process to reduce thickness of the SOG layer such that a thickness of the planarized SOG layer is substantially the same as a thickness of the contact pad; and
patterning the passivation layer and upper pad dielectric layer to expose a top surface of the contact pad after performing the planarization process.

17. A method for forming a device comprising:
providing a substrate having circuit component and a dielectric layer over the substrate, wherein the dielectric layer comprises a plurality of inter level dielectric (ILD) layers and the uppermost dielectric layer comprises at least one interconnect;
providing a pad dielectric layer which comprises a flowable dielectric material over the uppermost ILD layer;
forming a pad interconnect which is a wire bond pad configured for receiving a wire bond in the pad dielectric layer and a top surface of the pad interconnect is exposed such that the wire bond is to be attached and in direct contact thereto, wherein the pad interconnect is coupled to the at least one interconnect of the uppermost ILD layer, wherein a top surface of the pad dielectric layer is substantially coplanar with a top surface of the pad interconnect; and
forming a passivation layer over and in direct contact with the pad dielectric layer, wherein the passivation layer comprises a non-planar top surface having a first height closer to the pad interconnect and a second height away from the pad interconnect, wherein the first height is slightly higher than the second height, and the passivation layer is used for preventing a top surface of the pad interconnect from oxidation/corrosion and contamination during wire bonding and packaging process.

18. The method of claim 17, wherein:
providing the pad dielectric layer comprises forming a lower pad dielectric layer over the uppermost dielectric layer; and wherein
forming the pad interconnect comprises
forming a pad via contact opening in the lower pad dielectric layer,
forming a conductive layer on the substrate, wherein the conductive layer fills the pad via opening and covering the lower pad dielectric layer, and
patterning the conductive layer to form the pad interconnect having a contact pad over the lower pad dielectric layer and a pad via contact in the pad via opening.

19. The method of claim 18 wherein providing the pad dielectric layer further comprises forming an upper pad dielectric layer which comprises a spin on glass (SOG) layer over the lower pad dielectric layer and covers the contact pad, creating a step surface profile.

20. The method of claim 19 comprising performing a planarization process to remove a portion of the SOG layer over the contact pad to cause a top surface of the upper dielectric layer to be slightly below a top surface of the contact pad, thereby creating a small step profile between the upper pad dielectric layer and the contact pad.

* * * * *